(12) United States Patent
Skalinski et al.

(10) Patent No.: US 11,391,864 B2
(45) Date of Patent: Jul. 19, 2022

(54) SYSTEMS AND METHODS FOR GENERATING PERMEABILITY SCALING FUNCTIONS TO ESTIMATE PERMEABILITY

(71) Applicant: Chevron U.S.A. Inc., San Ramon, CA (US)

(72) Inventors: Mark Skalinski, Houston, TX (US); Rafael Salazar-Tio, Katy, TX (US); Robert Mallan, Houston, TX (US)

(73) Assignee: Chevron U.S.A. Inc., San Ramon, CA (US)

( * ) Notice: Subject to any disclaimer, the term of this patent is extended or adjusted under 35 U.S.C. 154(b) by 598 days.

(21) Appl. No.: 16/234,057

(22) Filed: Dec. 27, 2018

(65) Prior Publication Data
US 2019/0257977 A1     Aug. 22, 2019

Related U.S. Application Data

(60) Provisional application No. 62/632,696, filed on Feb. 20, 2018.

(51) Int. Cl.
| | | |
|---|---|---|
| *G01V 99/00* | (2009.01) | |
| *G01V 1/48* | (2006.01) | |
| *E21B 49/00* | (2006.01) | |
| *E21B 49/10* | (2006.01) | |
| *E21B 41/00* | (2006.01) | |
| *G06F 30/20* | (2020.01) | |

(52) U.S. Cl.
CPC .............. *G01V 99/00* (2013.01); *E21B 41/00* (2013.01); *E21B 49/008* (2013.01); *E21B 49/10* (2013.01); *G01V 1/48* (2013.01); *G06F 30/20* (2020.01); *G01V 2210/6246* (2013.01)

(58) Field of Classification Search
CPC .. G01V 99/00; G01V 1/48; G01V 2210/6246; G06F 30/20; E21B 41/00; E21B 49/008; E21B 49/10
See application file for complete search history.

(56) References Cited

U.S. PATENT DOCUMENTS

| | | |
|---|---|---|
| 5,265,015 A | 11/1993 | Auzerais |
| 8,725,477 B2 | 5/2014 | Zhang |
| 9,134,457 B2 | 9/2015 | Hurley |
| 9,229,127 B2 | 1/2016 | Leseur |

(Continued)

FOREIGN PATENT DOCUMENTS

WO     2012015515     2/2012

OTHER PUBLICATIONS

Dernaika M., et al., 2015, Multi☐scale rock analysis for improved characterization of complex carbonates, Society of Petroleum Engineers; 2015; SPED☐75598☐MS, 14 pages.

(Continued)

*Primary Examiner* — Andrew Schechter
*Assistant Examiner* — Kaleria Knox
(74) *Attorney, Agent, or Firm* — Esplin & Associates, PC

(57) ABSTRACT

Systems and methods for generating permeability scaling function for different features of interest are disclosed. Exemplary implementations may: obtain subsurface data sets; generate permeability scaling functions for individual features of interest; store the permeability scaling functions; and generate upscaled subsurface distributions using the permeability scaling functions.

20 Claims, 21 Drawing Sheets

(56) References Cited

U.S. PATENT DOCUMENTS

| | | | |
|---|---|---|---|
| 2009/0259446 A1* | 10/2009 | Zhang | G06F 30/20 |
| | | | 703/2 |
| 2009/0306945 A1* | 12/2009 | Wu | G01V 99/00 |
| | | | 703/2 |
| 2010/0057413 A1 | 3/2010 | Lee | |
| 2010/0161292 A1* | 6/2010 | Shook | E21B 49/00 |
| | | | 703/2 |
| 2012/0221306 A1 | 8/2012 | Hurley | |
| 2017/0191348 A1* | 7/2017 | AlThawad | E21B 41/0092 |

OTHER PUBLICATIONS

Dernaika M., et al., 2017, Upscaled permeability and rock types in a heterogeneous carbonate core from the middle east, Society of Petroleum Engineers, 2017, SPE☐185991☐DMS, 20 pages.

Skalinski et al., 2001, Application of Improved Method for Permeability Estimation in Complex Lithology Reservoirs, SPWLA 42nd Annual Logging Symposium, Jun. 17-20, 2001, SPWLA☐2001☐DC, 14 pages.

PCT International Application No. PCT/US18/67720, International Search Report and Written Opinion dated Mar. 22, 2019 (11 pages).

\* cited by examiner

SYSTEMS AND METHODS FOR GENERATING PERMEABILITY SCALING FUNCTIONS TO ESTIMATE PERMEABILITY

CROSS-REFERENCE TO RELATED APPLICATIONS

This Application claims the benefit of United States Provisional Patent Application No. 62/632,696, entitled "SYSTEMS AND METHODS FOR GENERATING PERMEABILITY SCALING FUNCTIONS TO ESTIMATE PERMEABILITY", filed Feb. 20, 2018, the content of which is incorporated herein by reference in its entirety.

BACKGROUND

Assessment of net pay cutoffs in carbonates is more challenging than in clastics due to inherent heterogeneity of pore architecture and permeability. Historically, the success rate of flowing perforations is low, and operators tend to "over-perforate" to capture all potential flowing zones. Asset teams must assign net thicknesses for modeling and resources assessment. Simple porosity cutoffs which might be adequate for sandstones often fail in complex carbonates.

Net pay estimations may drive most of exploration and development decisions. However, there are no clear standards and workflows for the definitions and methods of derivation.

Reservoir class, i.e., clastic vs carbonates, may add to the confusion driving different approaches. Although most of the "community of practice" is using cutoffs, there is another approach (especially in carbonates) advocating unrestricted input data to the reservoir models and usage of model outputs. The main driver for this approach is a sparse nature of fractures controlling the flow from tight matrices in some fields. Net reservoir assessment may be a variable realization of simulation models.

Carbonate reservoirs pose a special challenge for net pay definitions due to their heterogeneity, poor correlation between porosity and permeability, non-Archie behavior which creates a challenge for saturation models, wettability effects, complex mineralogy and pore systems.

FIELD OF THE DISCLOSURE

The present disclosure relates to systems and methods for generating permeability scaling functions to estimate permeability.

SUMMARY

One aspect of the present disclosure relates to a method for generating permeability scaling functions for different features of interest. The method may include obtaining, from the electronic storage, subsurface data sets. A given subsurface data set corresponds to a given region of interest within a given feature of interest and may specify permeability values as a function of position within the given region of interest. The method may include generating, with the one or more physical computer processors, permeability scaling functions for individual features of interest. The permeability scaling functions for the given feature of interest may be generated based on the subsurface data sets. The method may include storing the permeability scaling functions in the electronic storage. The method may include generating, with the one or more physical computer processors, upscaled subsurface distributions using the permeability scaling functions. The upscaled subsurface distributions may correspond to a larger region of interest within the given feature of interest and estimates permeability distributions of the larger region of interest.

One aspect of the present disclosure relates to a method for estimating permeability for different features of interest. The method may include obtaining initial target subsurface data sets of a region of interest. The method may include obtaining, from the electronic storage, permeability scaling functions. The permeability scaling functions may have been generated based on subsurface data sets. The subsurface data sets may include permeability spatial distributions using permeability measurements and tomographic imaging of a core slab. The method may include generating, with the one or more physical computer processors, upscaled target subsurface distributions using the permeability scaling functions. The upscaled subsurface distributions may correspond to a larger region of interest within a given feature of interest and may estimate permeability distributions of the larger region of interest. The method may include obtaining, from the electronic storage, a refined subsurface model. The refined subsurface model may have been trained using subsurface models. The method may include using the refined subsurface model to generate upscaled target subsurface data sets.

One aspect of the present disclosure relates to a system configured for estimating permeability for different features of interest. The system may include non-transient electronic storage and one or more physical computer processors configured by machine-readable instructions. The processor(s) may be configured to obtain initial target subsurface data sets of a region of interest. The processor(s) may be configured to obtain, from the electronic storage, permeability scaling functions. The permeability scaling functions may have been generated based on subsurface data sets. The subsurface data sets comprise permeability spatial distributions using permeability measurements and tomographic imaging of a core slab. The processor(s) may be configured to generate upscaled target subsurface distributions using the permeability scaling function. The upscaled subsurface distributions may correspond to a larger region of interest within a given feature of interest and may estimate permeability distributions of the larger region of interest. The processor(s) may be configured to obtain, from the electronic storage, a refined subsurface model. The refined subsurface model may have been trained using subsurface models. The processor(s) may be configured to use the refined subsurface model to generate upscaled target subsurface data sets.

One aspect of the present disclosure relates to a system configured for generating permeability scaling functions for different features of interest to estimate permeability. The system may include electronic storage and one or more physical computer processors configured by machine-readable instructions. The processor(s) may be configured to obtain, from the electronic storage, subsurface data sets. A given subsurface data set corresponds to a given region of interest within a given feature of interest and may specify permeability values as a function of position within the given region of interest. The processor(s) may be configured to generate permeability scaling functions for individual features of interest. The permeability scaling functions for the given feature of interest may be generated based on the subsurface data sets. The processor(s) may be configured to store the permeability scaling functions in the electronic storage. The processor(s) may be configured to estimate upscaled subsurface distributions using the permeability scaling functions. The upscaled subsurface distributions may correspond to a larger region of interest within the given feature of interest and may estimate permeability distributions of the larger region of interest.

These and other features, and characteristics of the present technology, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the presently disclosed technology. As used in the specification and in the claims, the singular form of "a", "an", and "the" include plural referents unless the context clearly dictates otherwise.

DETAILED DESCRIPTION

Figure 1:
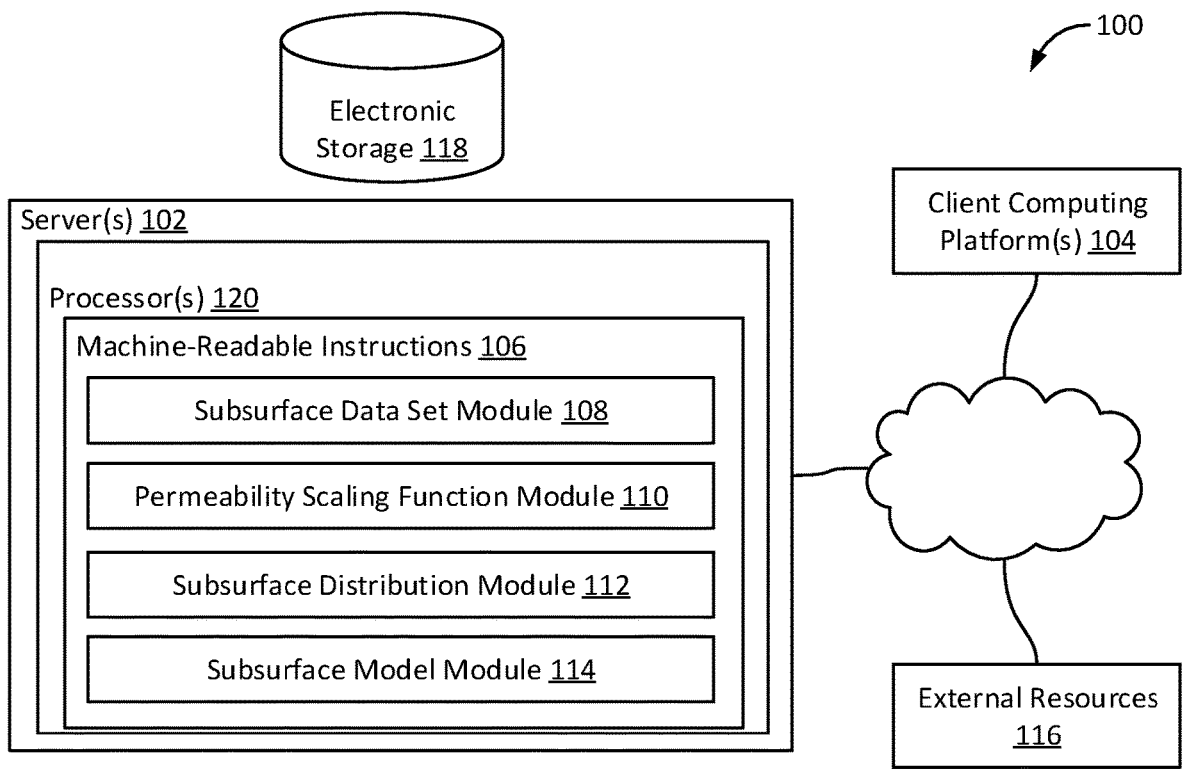
FIG. 1 illustrates a system configured for estimating permeability of different features of interest, in accordance with one or more implementations.

Systems and methods configured to estimate permeability values are often constrained by various elements. Plug-sized core samples extracted from a drilled well may not be a representative elementary volume (REV). A REV may be the smallest volume over which a measurement can be taken to be representative of the entire volume. In some implementations, an entire core sample may be insufficient as well. While the entire core sample may be better than plug core samples, entire core samples are costly, require a longer time for cleaning and taking measurements, among other issues.

Currently, the resulting core data from plug core samples may be used to generate reservoir models by applying transforms or statistical models linking permeability to log data. These techniques may upscale the core data only using flow based averaging. Existing technologies may use numerical pseudocores based on wrapped two-dimensional borehole image logs from which facies are identified: a rock matrix; conductive patches representing intergranular porosity; and vugs. A three-dimensional numerical pseudocore may be statistically generated using multi-point statistics (MPS) modeling by merging the image log data with available digital core data. The properties may be distributed to the model grid for which constant porosity and permeability values are assigned for each grid voxel according to the three rock types. The resulting permeability field used for simulation corresponds to the original core data with no upscaling.

Accordingly, the technology described herein provides advantages compared to such existing technology. These advantages include at least more accurate and precise permeability measurement of a given sample by using mini-permeameters and computed tomography (CT) devices, which in turn leads to higher quality upscaled data; correlations based on individual rock types; correlations based on heterogeneity metrics of the core samples; improved simulation models; reduced discrepancies between production forecasts and actual production; improved operational decisions; and better investment in subsurface regions of interest.

For example, our method may use one or more mini-permeability maps which are distributed to the whole core using whole core CT data. One or more permeability scaling functions may be defined using Darcy simulation to increasing a length of the core. The one or more permeability scaling functions may be used to generate estimated effective permeabilities for different model sizes (about 1 to about 100 cm) including log scale (about 60 cm). Core permeability may be upscaled to the log scale. Using an optimal set of one or more logs, one or more prediction models may be defined using a KNN method. Log predicted upscaled permeability may be used as an input to simulation models.

In some implementations of the presently disclosed technology, core samples may be analyzed and modeled to represent a distribution of permeability values. The distribution of permeability values may be fitted to estimate how the distribution of permeability values may change as the size of the core sample increases. In this fitting process, a permeability scaling function may be determined. The permeability scaling function may be used to estimate a distribution of permeability values for a larger core sample. The estimated distribution of permeability values may be compared against various logs, such as porosity logs and derivations of porosity logs, to determine a match to the estimated distribution of permeability values. A combination of logs may be used to match the estimated distribution of permeability values. This combination of logs may specify estimated permeability values of a larger core sample.

FIG. 1 illustrates a system 100 configured for determining permeability distributions of a given feature of interest, in accordance with one or more implementations. In some implementations, system 100 may include one or more servers 102. Server(s) 102 may be configured to communicate with one or more client computing platforms 104 according to a client/server architecture and/or other architectures. Client computing platform(s) 104 may be configured to communicate with other client computing platforms via server(s) 102 and/or according to a peer-to-peer architecture and/or other architectures. Users may access system 100 via client computing platform(s) 104.

Server(s) 102 may be configured by machine-readable instructions 106. Machine-readable instructions 106 may include one or more instruction components. The instruction components may include computer program components. The instruction components may include one or more of a subsurface data set component 108, a permeability scaling function component 110, a subsurface distribution component 112, a subsurface model component 114, and/or other instruction components.

Subsurface data set component 108 may be configured to obtain subsurface data sets. A given subsurface data set corresponds to a given region of interest within a given feature of interest and may specify permeability values as a function of position within the given region of interest. Subsurface data sets may be core and log data acquired from wells. The subsurface data sets may be prepared using core analysis, application of Klinkenberg corrections, net overburden corrections, core log depth matching, and/or other analysis. Permeability may be the ability to transmit fluids.

The given region of interest may represent a smaller region than the given feature of interest. For example, a given region of interest may be a cubic centimeter volume. The given feature of interest may include a sample taken from a larger core extracted during drilling, a core extracted during drilling, a rock type/classification, and/or other subsurface objects. The given feature of interest may be meters and/or kilometers long. The given feature of interest may be a rock, minerals, dirt, organic matter, glass, and/or other subsurface materials. For example, a rock may be classified as a breccia, a muddy rock, a grainy rock, a boundstone, and/or other classifications.

Subsurface data sets may include, permeability measurements combined with tomographic images that are analyzed using fluid flow simulations, classifications of rock type, heterogeneity metrics, and/or other information that may help determine a permeability scaling function. A given subsurface data set may correspond to the given region of interest and/or the given feature of interest. For example, subsurface data sets include permeability spatial distributions using permeability measurements and tomographic imaging of a core slab, as illustrated in FIGS. 5-7B. The spatial distribution may include permeability as a function of position within a region of interest. The core slab may include at least some portion of the core extracted from a well.

Figure 5:
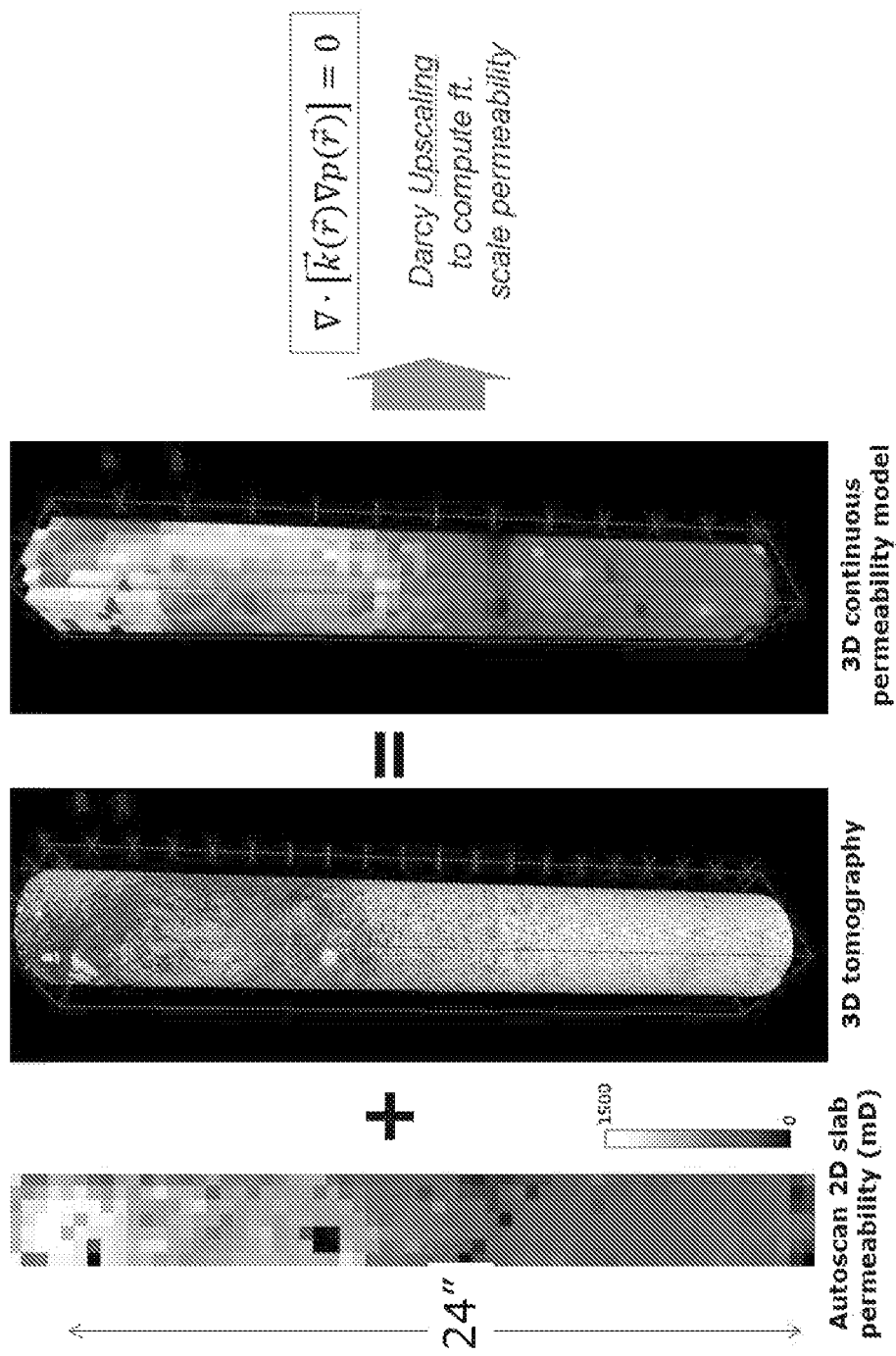
FIG. 5 illustrates permeability spatial distributions of a core slab used for a Darcy solver, in accordance with one or more implementations.
Figure 16:
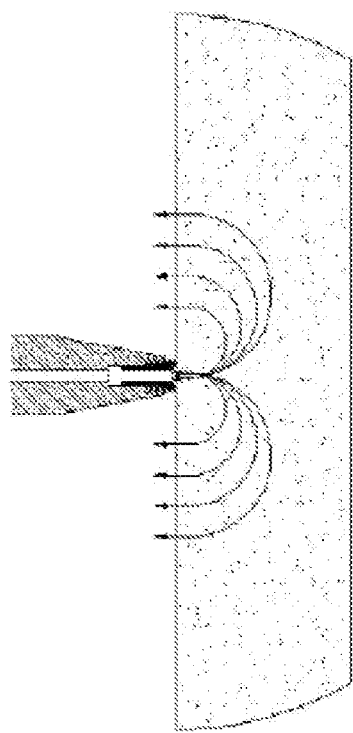
FIG. 16 illustrates an example mini-permeameter, in accordance with one or more implementations.

For example, permeability measurements may be taken, as illustrated in FIG. 5. In some implementations, a mini-permeameter may be used to measure permeability. A mini-permeameter, as illustrated in FIG. 16, may be a gas-based device for measuring permeability in porous mediums, such as, for example, rocks. In implementations, measurements may be taken in substantially even intervals, such as, for example, 1 cm intervals. In some implementations, a mini permeameter may inject a gas at a given flow rate and measure the pressure drop at steady state flow. Based on the given flow rate and the pressure drop a local permeability value may be calculated.

Tomographic images may be captured using computed tomography (CT), as illustrated in FIG. 5. In some implementations, the CT device may be a helical device capable of capturing an image of a three-dimensional object such as a core sample. The two-dimensional permeability measurements may be correlated to the three-dimensional tomographic images to generate three-dimensional permeability measurements. In some implementations, a three-dimensional permeability grid of the core sample may be constructed. A person having ordinary skill in the art may realize other imaging techniques to capture the region of interest.

Figure 6:
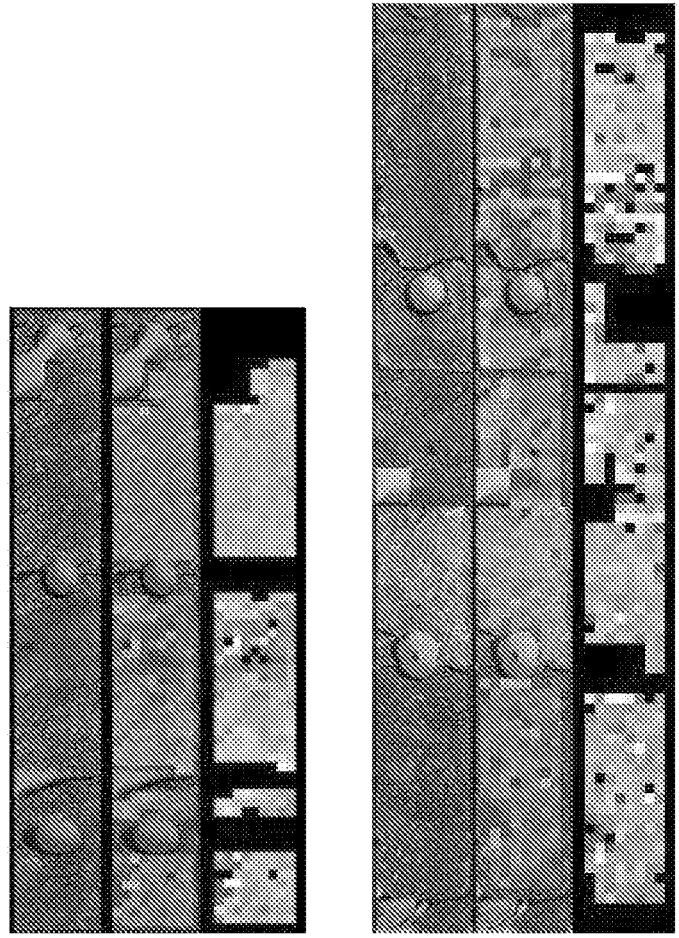
FIG. 6 illustrates permeability spatial distributions of core samples, in accordance with one or more implementations.
Figure 7B:
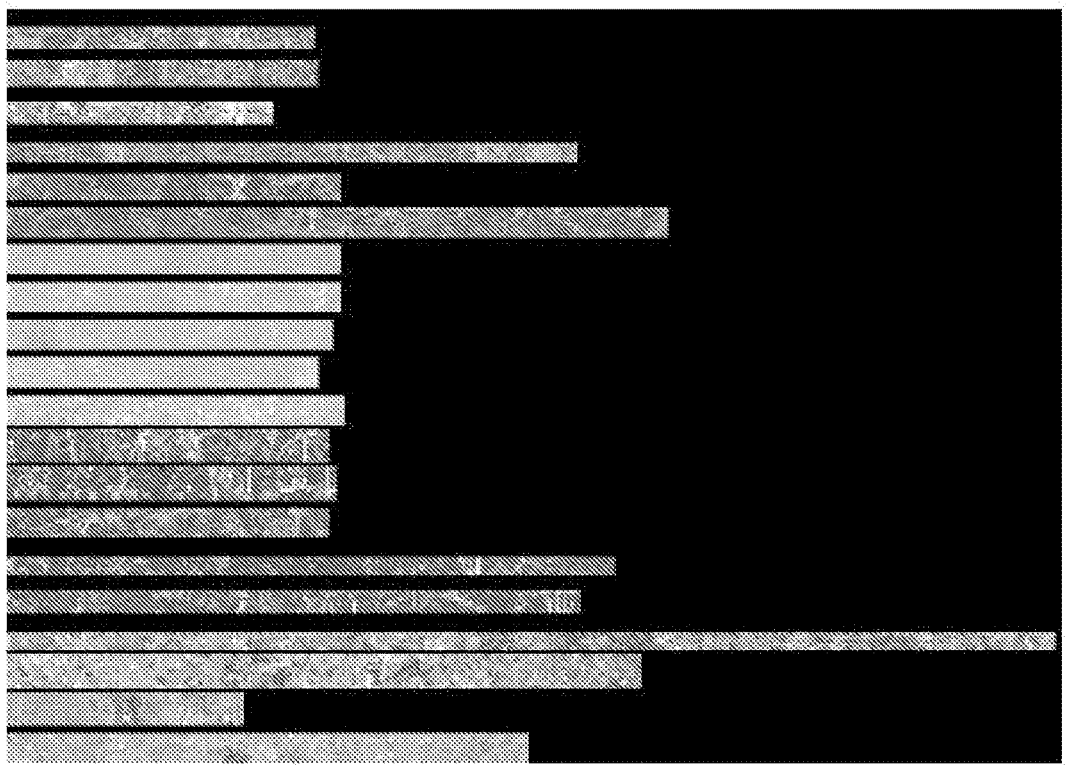
FIG. 7B illustrates permeability spatial distributions of core samples, in accordance with one or more implementations.
Figure 7A:
FIG. 7A illustrates permeability spatial distributions of core samples, in accordance with one or more implementations.

As described above, the permeability measurements and tomographic images, which may both be taken from a core slab, may be combined to generate three-dimensional permeability spatial distributions. When there is incomplete data on a sample of the core, as illustrated in FIGS. 6 and 7A, values may be interpolated using the mean, standard deviation, surrounding measured points, weighted averages, Gaussians, adding noise to individual interpolated values, and/or other techniques. Interpolated data may be combined with measured data, as shown in FIG. 7B, so that fluid flow simulations based on different sized samples of the core may be applied to the interpolated data. Fluid flow simulations may include a Darcy solver and/or other fluid flow equations.

Figure 8A:
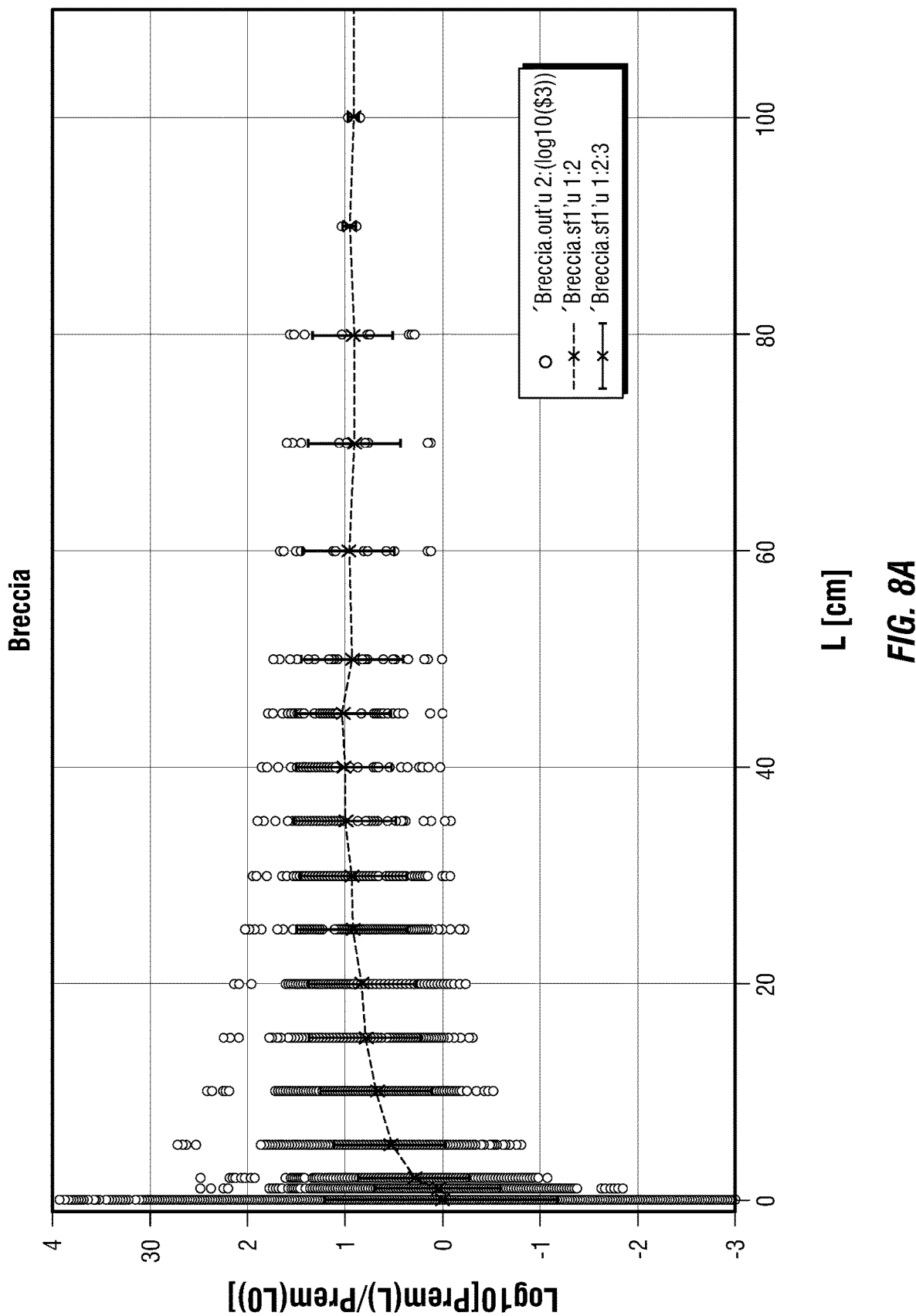
FIG. 8A illustrates permeability distributions as a function of core sample length, in accordance with one or more implementations.
Figure 8B:
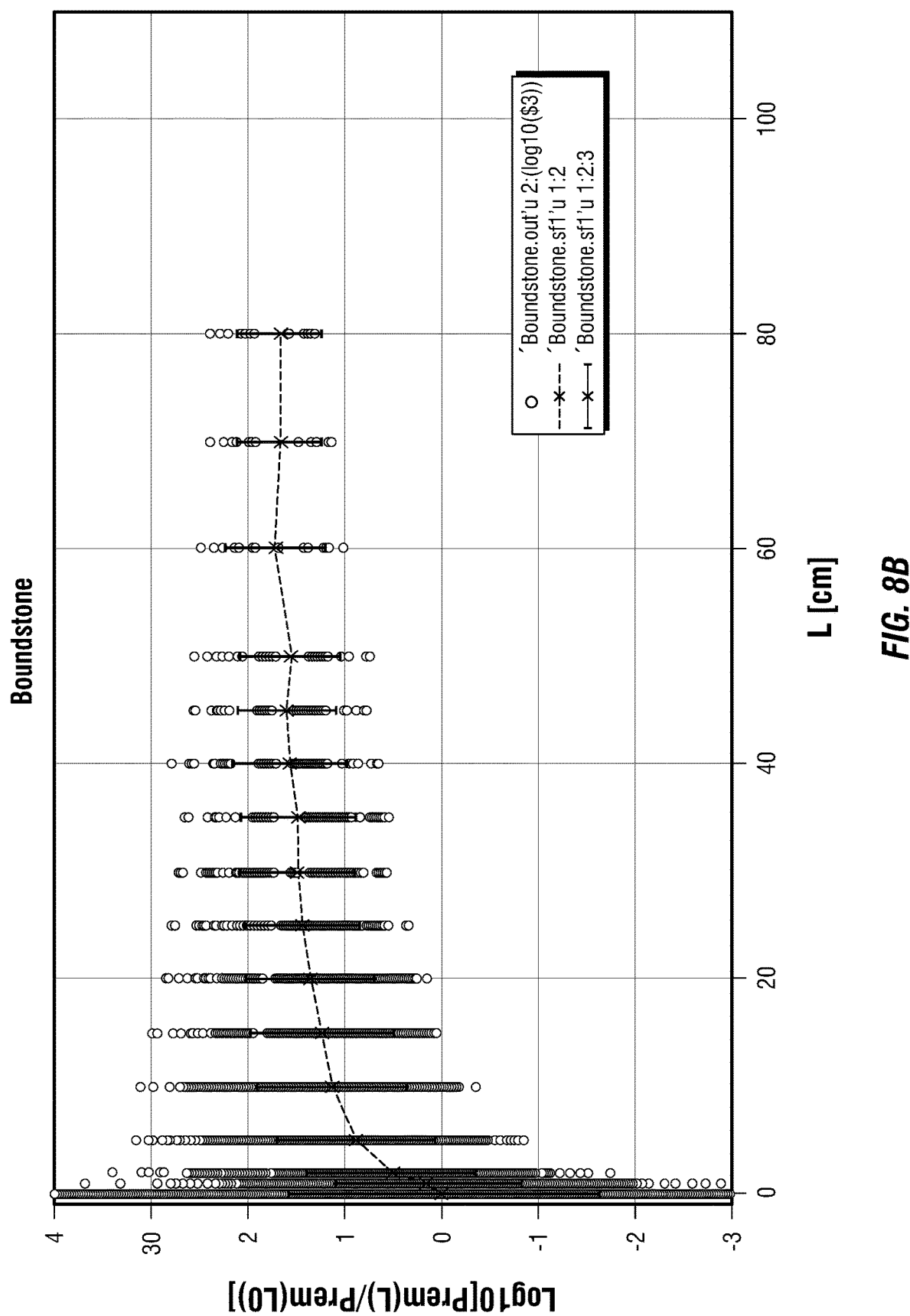
FIG. 8B illustrates permeability distributions as a function of core sample length, in accordance with one or more implementations.
Figure 8C:
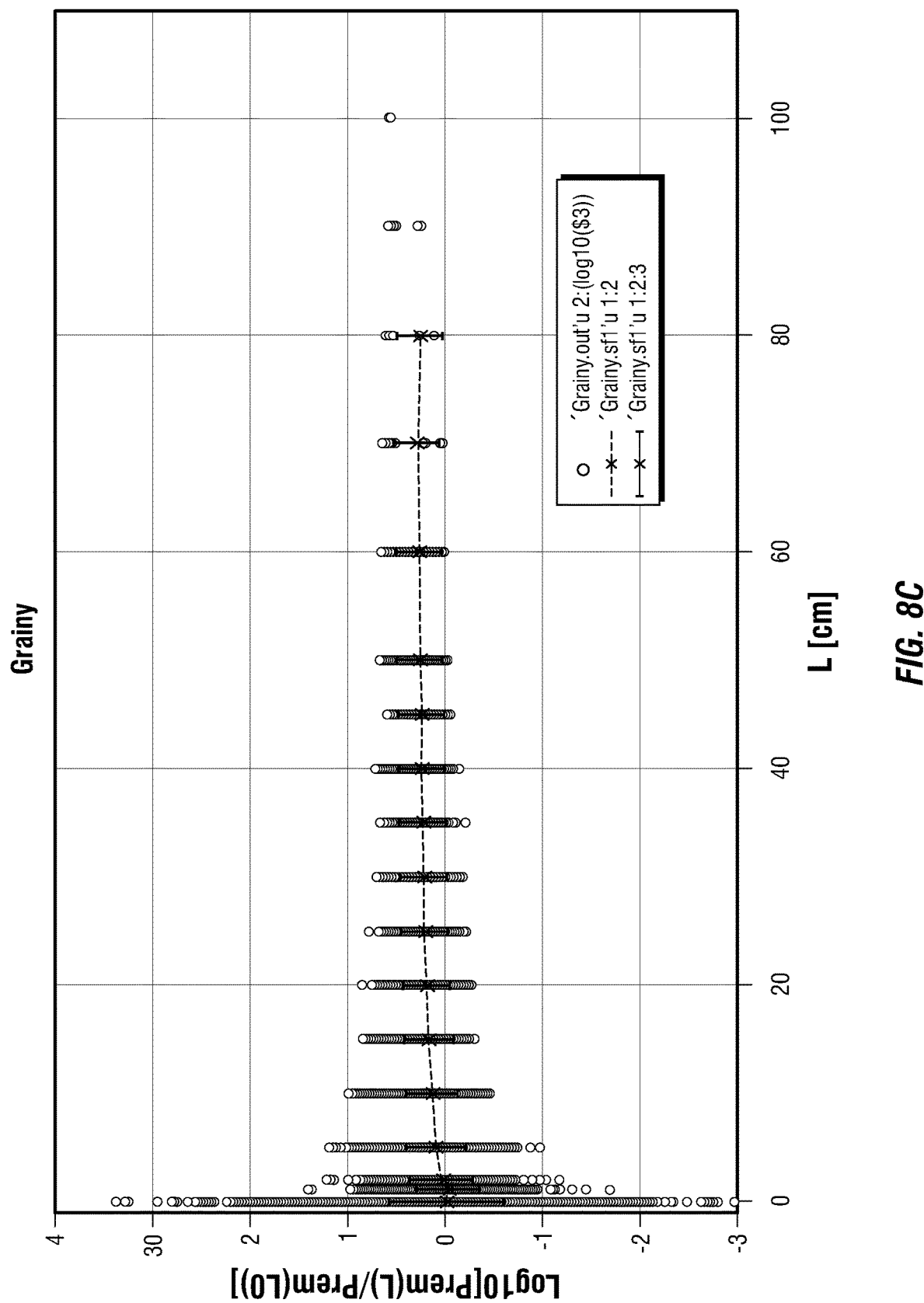
FIG. 8C illustrates permeability distributions as a function of core sample length, in accordance with one or more implementations.
Figure 8D:
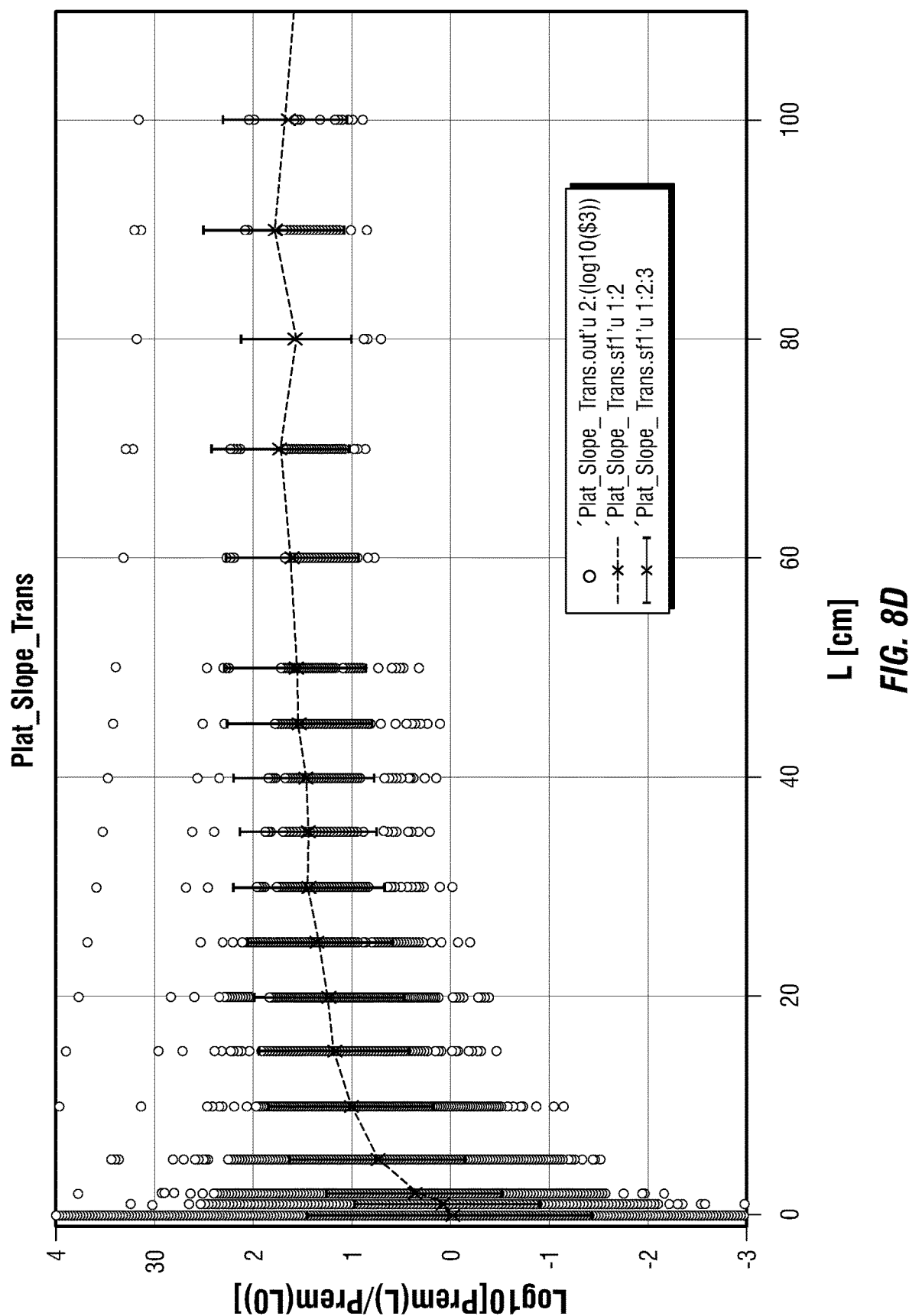
FIG. 8D illustrates permeability distributions as a function of core sample length, in accordance with one or more implementations.
Figure 8E:
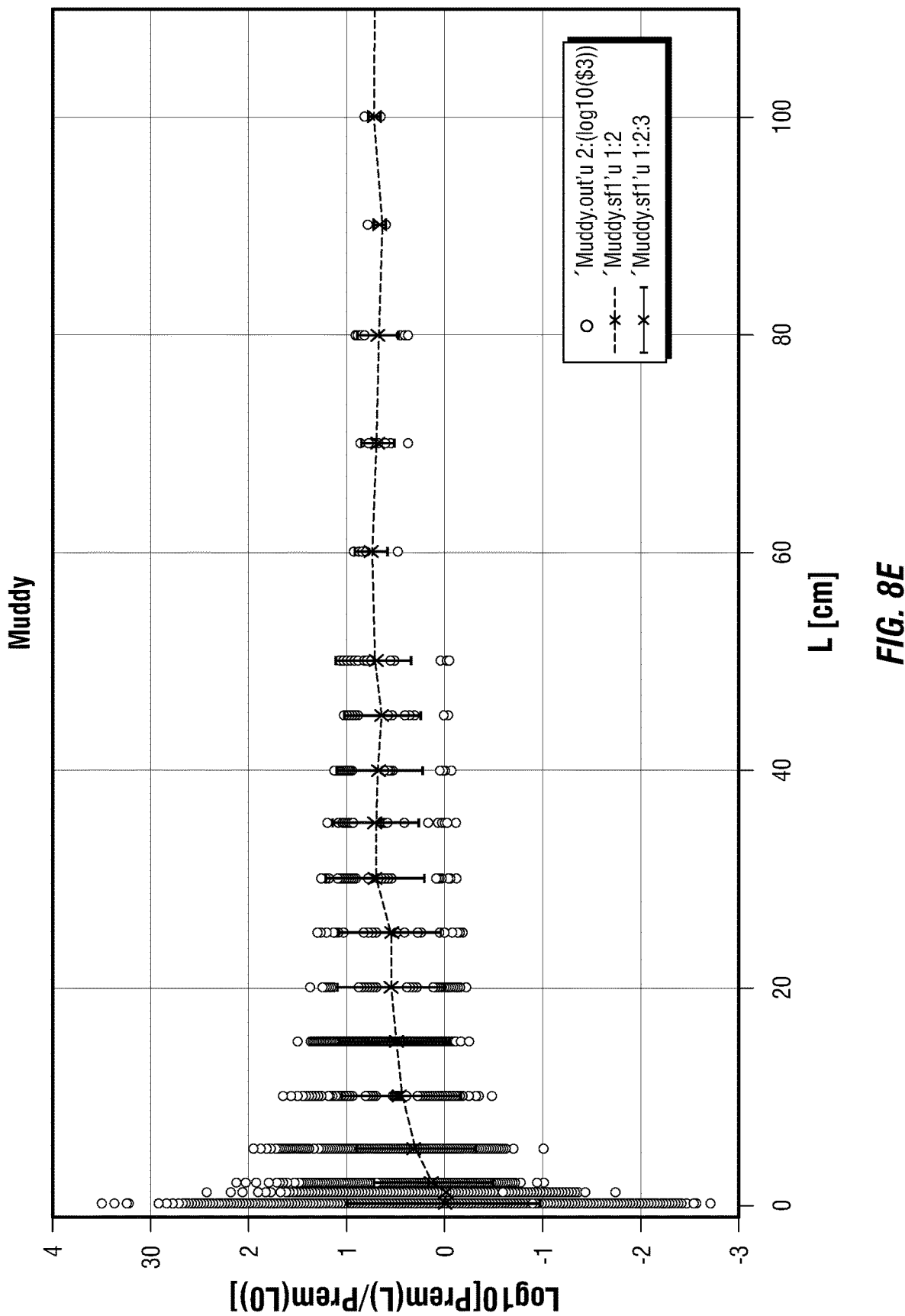
FIG. 8E illustrates permeability distributions as a function of core sample length, in accordance with one or more implementations.

The subsurface data sets may include classifications of rock types. Using the classifications of rock types, the permeability scaling function may be determined, as illustrated in FIGS. 8A-8E. Grouping measurements by classification may reveal limits at which a sample at a given length may be an REV. For example, as shown in FIG. 8A, the data becomes more consistent between about 30 and about 40 centimeters.

The subsurface data sets may include heterogeneity metrics. The heterogeneity metrics may include correspondences between a Dykstra Parsons coefficient of plug permeability measurements and a scaling multiplier. In implementations, to obtain the Dykstra Parsons coefficient, permeability measurements may be arranged in descending order and a percent of total values that exceed an individual measurement is calculated. The calculated values are then graphed on a log probability plot. A linear analysis is applied through the calculated values, where individual values may be weighted differently (e.g., more weight on values between about 10% to about 90%). The resulting line is used to determine the heterogeneity and dispersion of the core sample. For example, the permeability variation, V, may be found using the following equation:

$$V = \frac{k_{50} - k_{84.1}}{k_{50}}$$

where $k_{50}$ is the mean permeability and $k_{84.1}$ is the mean permeability plus one standard deviation.

The heterogeneity metrics may include correspondences between a ratio of standard deviation to an average of the logarithm of permeability measurements and a scaling multiplier. The ratio may be a magnitude relation. The ratio may include the relative magnitudes of two quantities, according to some implementations. The standard deviation may be a variance. The standard deviation may include the square root of the variance, according to some implementations. The logarithm may be an exponent. The logarithm may include the exponent required to produce a given number, according to some implementations. Examples of the logarithm may include one or more of common logarithm, natural logarithm, and/or other logarithms.

Referring back to FIG. 1, subsurface data set component 108 may be configured to use the refined subsurface model to estimate upscaled subsurface data sets. The upscaled subsurface data set may estimate permeability values of a larger region of interest within the given feature of interest. The larger region of interest may be centimeters, meters, or kilometers. The refined subsurface model may include a combination of logs and derivatives of logs. The logs may include core logs, well logs, and/or other subsurface and sample logs. In some implementations, multiple refined subsurface models may be generated to account for variability from random realizations.

Subsurface data set component 108 may be configured to generate upscaled subsurface data sets using a refined subsurface model. The upscaled subsurface data sets may include estimated permeability of a larger region of interest than the subsurface data sets. The upscaled subsurface data sets may be generated using the same combination of logs used in the refined subsurface model with data from a target region of interest.

Figure 10A:
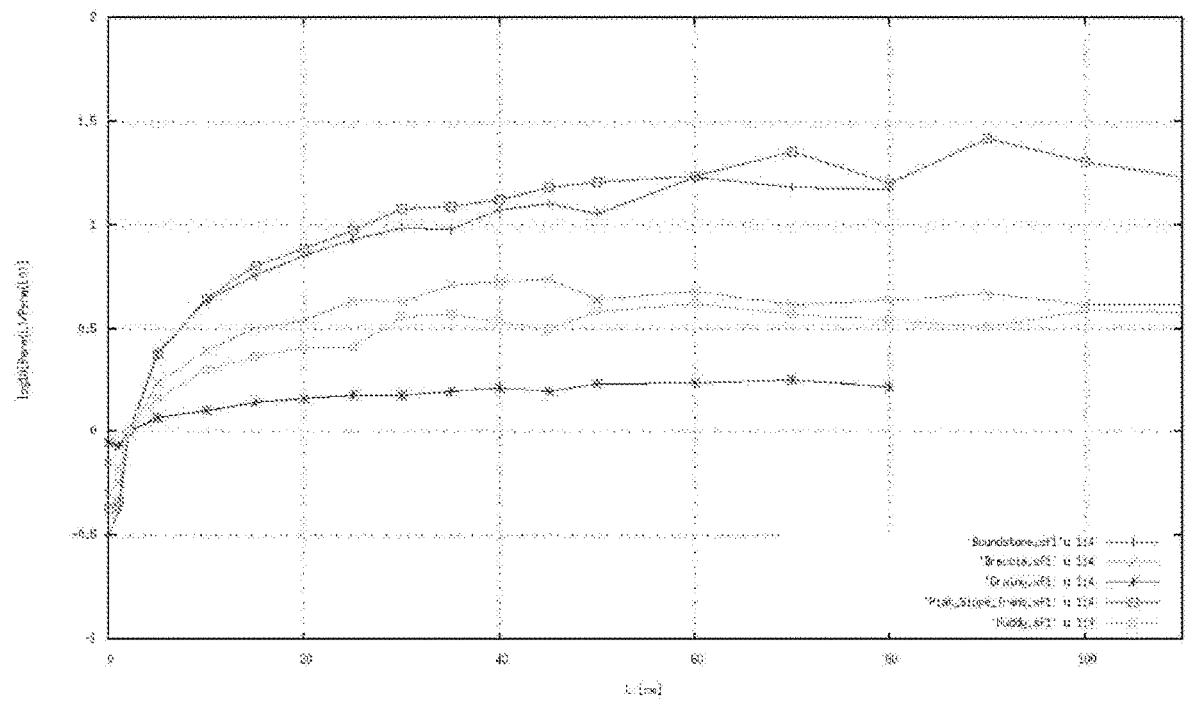
FIG. 10A illustrates scaling functions for different features of interest, in accordance with one or more implementations.
Figure 10B:
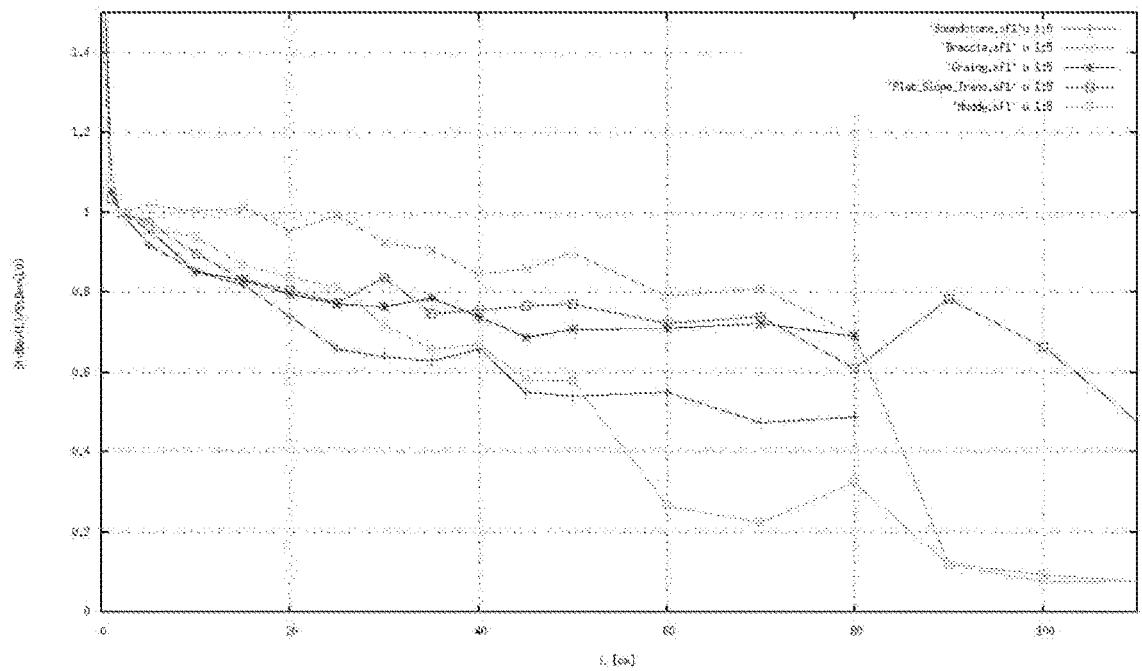
FIG. 10B illustrates scaling functions for different features of interest, in accordance with one or more implementations.

Permeability scaling function component 110 may be configured to generate permeability scaling functions for individual features of interest. The permeability scaling functions, as shown in FIGS. 10A and 10B, for the given feature of interest may be generated based on subsurface data sets. For example, continuing the example above, the fluid flow simulations of the permeability measurements and tomographic images may use a Darcy solver to estimate the permeability as a function of size. The results of using the Darcy solver may be grouped by rock classifications, as illustrated in FIGS. 8A-8E, which may help define the permeability scaling functions.

Figure 9A:
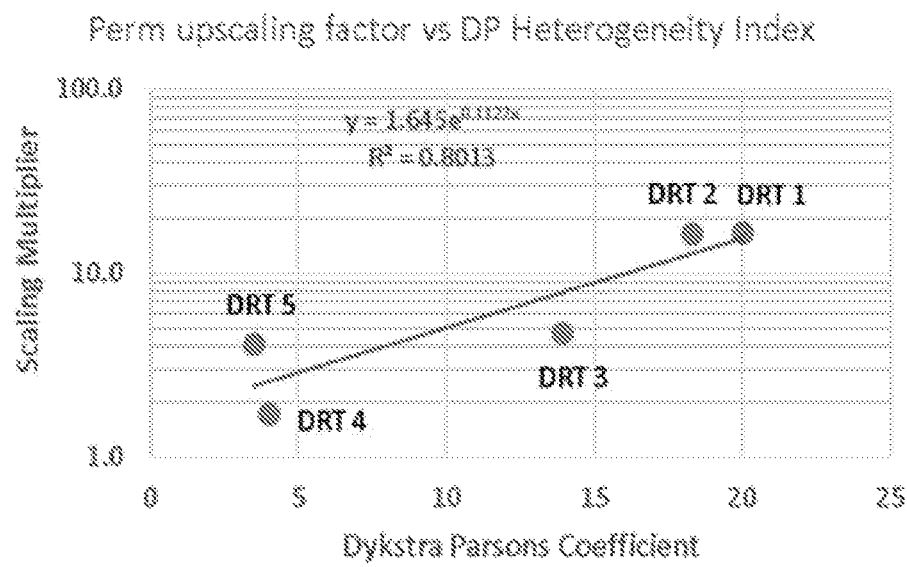
FIG. 9A illustrates a heterogeneity index as a function of a scaling multiplier, in accordance with one or more implementations.
Figure 9B:
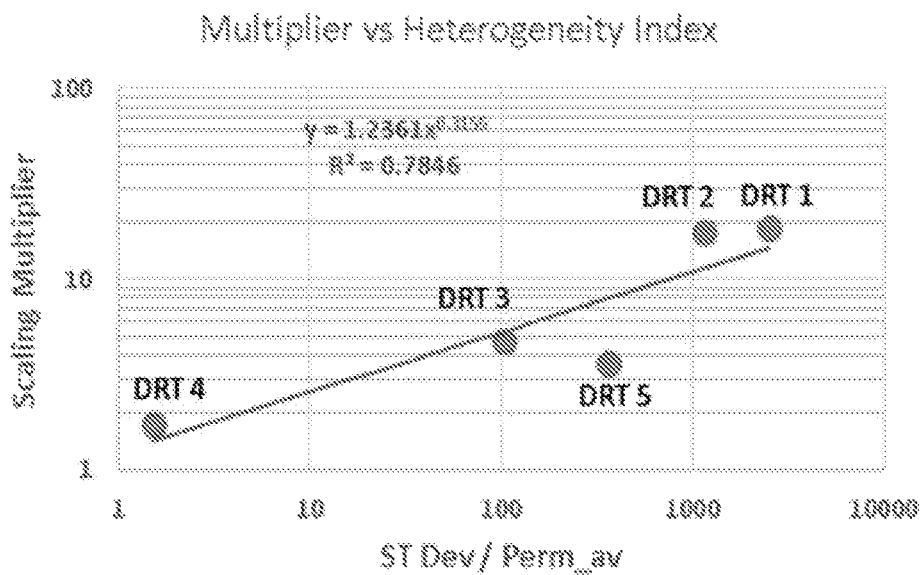
FIG. 9B illustrates a heterogeneity index as a function of a scaling multiplier, in accordance with one or more implementations.

The permeability scaling functions may also be defined by a correspondence between a heterogeneity index from logs and a scaling multiplier, as illustrated in FIGS. 9A and 9B. The heterogeneity index may help define the degree of heterogeneity within the region of interest. The heterogeneity index may include a Dykstra Parsons coefficient of plug permeability measurements, the ratio of standard deviation to the average of the logarithm of mini permeameter data, and/or other heterogeneity indices. The Dykstra Parsons coefficient may be used to help determine heterogeneity.

Referring back to FIG. 1, permeability scaling function component 110 may be configured to store the permeability scaling functions in the electronic storage.

Permeability scaling function component 110 may be configured to obtain the permeability scaling functions.

Figure 11:
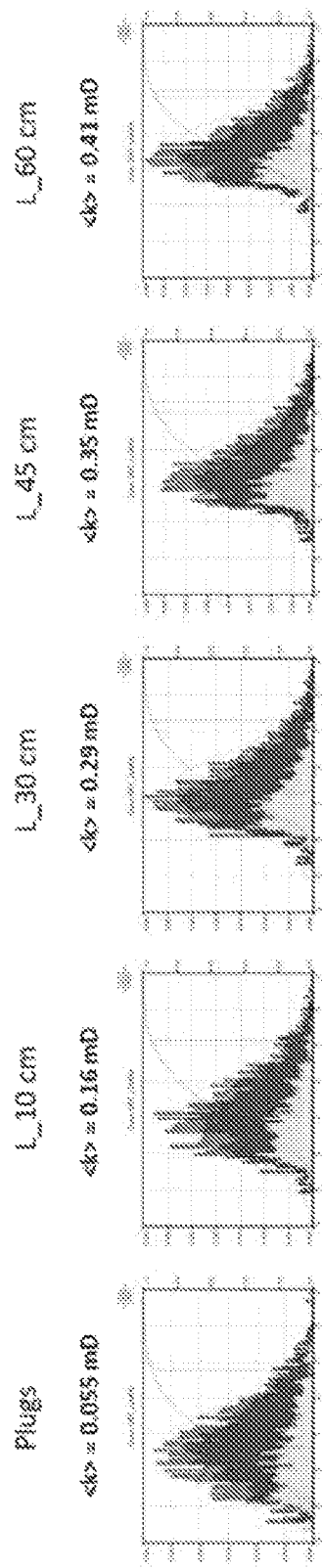
FIG. 11 illustrates a sample permeability distribution with upscaled permeability distributions at different lengths, in accordance with one or more implementations.
Figure 17:
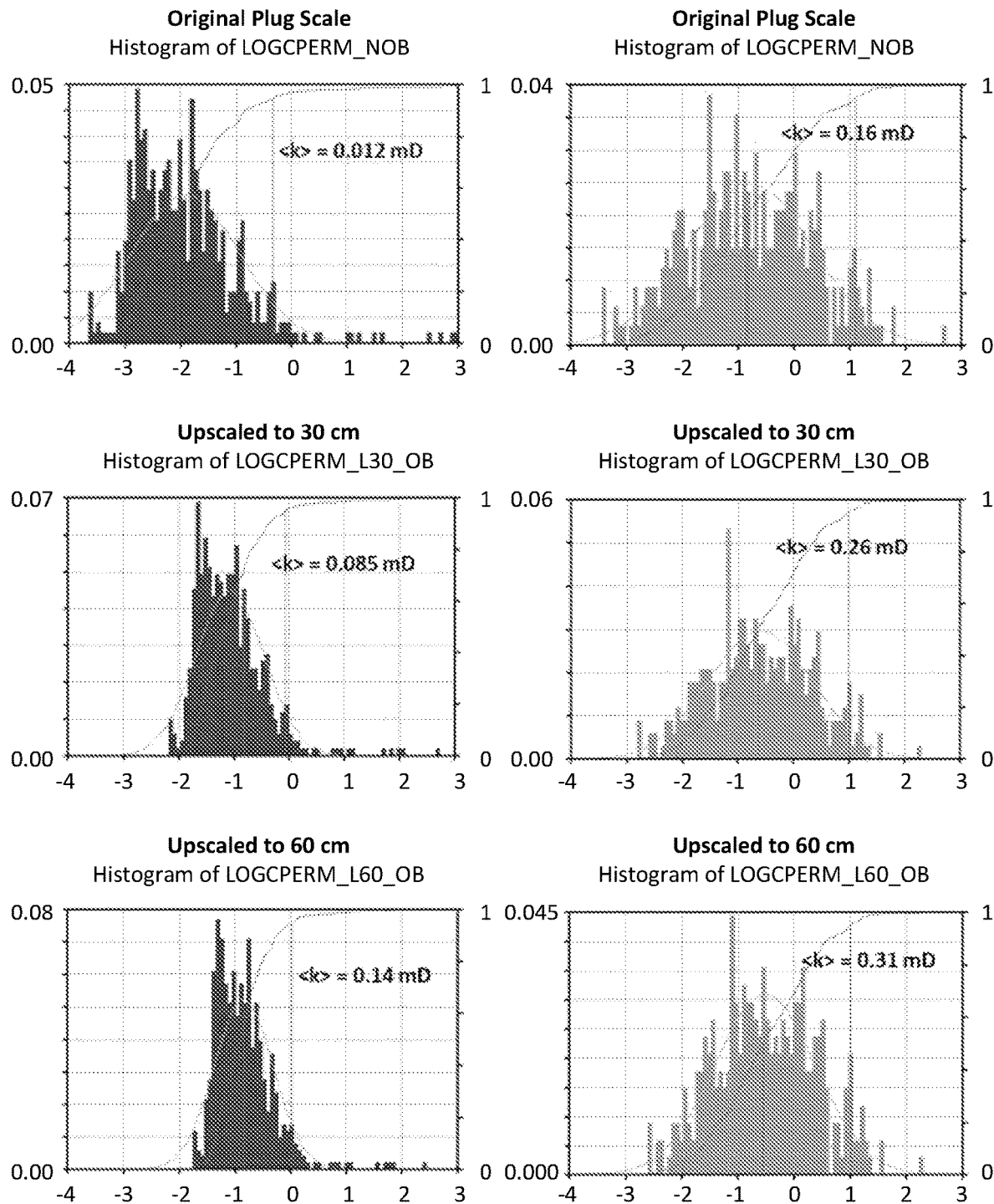
FIG. 17 illustrates sample permeability distributions with upscaled permeability distributions at different lengths, in accordance with one or more implementations.

Subsurface distribution component 112 may be configured to generate upscaled subsurface distributions using the permeability scaling functions. The upscaled subsurface distributions may correspond to a larger region of interest within the given feature of interest and may estimate permeability distributions of the larger region of interest. In some implementations, the larger region of interest may not be limited to the given feature of interest. The larger region of interest may be centimeters, meters, and/or other regions. For example, as shown in FIG. 11, the permeability distribution of upscaled wells at different lengths is shown. Permeability, as represented by the <k> value in FIG. 11, increases about 8 fold from the known plug distribution to an upscaled 60 cm distribution. FIG. 17 illustrates sample permeability distributions with upscaled permeability distributions at different lengths, in accordance with one or more implementations. As illustrated, permeability increases more for heterogeneous rock types (e.g., boundstone) than for more homogeneous rock types (e.g., grainstone). The permeability distribution for boundstone rock types are illustrated on the top row at original scale, upscaled to about 30 cm, and upscaled to about 60 cm. Permeability increases from upscaling from about 0.012 mD to about 0.14 mD. The standard deviation decreases from upscaling for the boundstone rock type. The permeability distribution for grainstone rock types are illustrated on the bottom row at original scale, upscaled to about 30 cm, and upscaled to about 60 cm. Permeability increases from upscaling from about 0.16 mD to about 0.31 mD. The standard deviation changes minimally for the grainstone rock type from upscaling.

In implementations, a transform may be applied to generate upscaled subsurface distributions, such as, for example:

$$\log k_i = (\log k_i - \langle \log k_i \rangle) \frac{\sigma_L}{\sigma_{L_0}} + (\langle \log k_L \rangle - \langle \log k_{L_0} \rangle) + \langle \log k_i \rangle$$

where $k_i$ represents plug permeability and $\langle \log k_L \rangle$ and $\sigma_L$ represent the log mean value and standard deviation for a given scale L, respectively.

Referring back to FIG. 1, subsurface model component 114 may be configured to obtain subsurface models of the region of interest. The subsurface models may include logs and derivatives of logs. Logs may include wireline logs, logging while drilling (LWD) logs, raw logs, transform logs, derivatives of logs, and/or other logs of a core, a well, and/or other regions of interest. The derivative may include the result of mathematical differentiation, the instantaneous change of one quantity relative to another, according to some implementations. Examples of the derivative may include one or more of curvature, partial derivative, and/or other derivatives.

Figure 12:
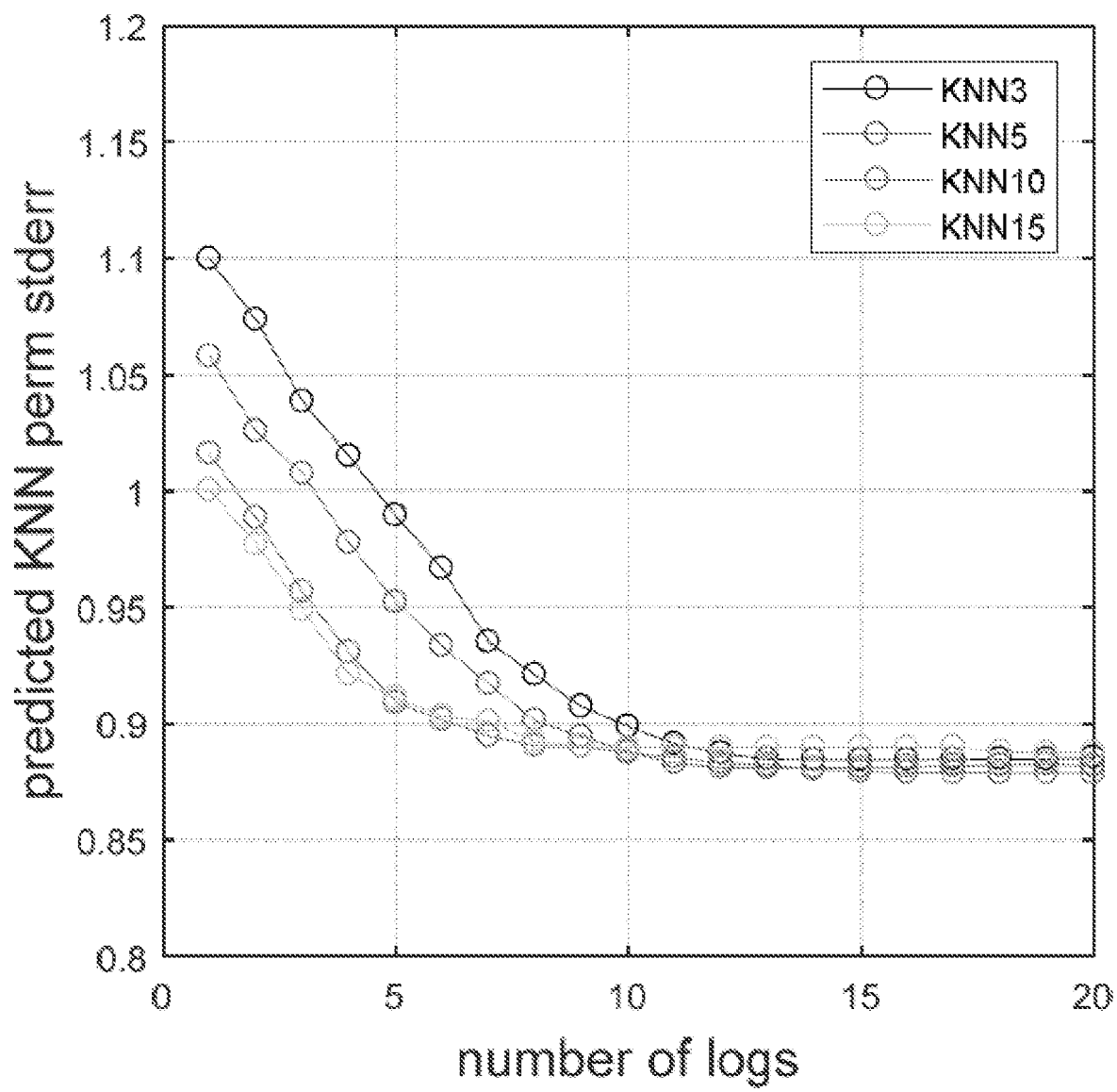
FIG. 12 illustrates the number of logs that need to be combine to estimate upscaled permeability, in accordance with one or more implementations.

Subsurface model component 114 may be configured to generate a refined subsurface model by training, using the upscaled subsurface distributions, the subsurface models. Training the subsurface models may include using a k-nearest neighbor (k-NN) method to determine a combination of subsurface models to fit the upscaled subsurface distributions, as illustrated in FIG. 12. K-NN may use neighboring logs to determine class membership and weigh the predictive capability of a log or combination of logs. Other machine learning techniques may be used, such as convolutional neural networks, kernel machines, condensed nearest neighbor, and/or decisions forests.

In implementations, the subsurface models may be trained using a step-wise method. For example, all of the logs may be independently evaluated to determine a first log which is the best predictor of permeability. All of the logs besides the first log may then be independently evaluated to determine a second log, which in combination with the first log, best predicts permeability. This step-wise method may continue until a prediction error for adding another log is below a threshold value (e.g., around 1% error, although it should be appreciated that different applications would require different thresholds). The resulting log may be used to identify the best combination of logs to predict permeability. In some implementations, this may be combined with k-NN to find an optimal combination of logs at the optimal k-NN.

Figures 13A, 13B:
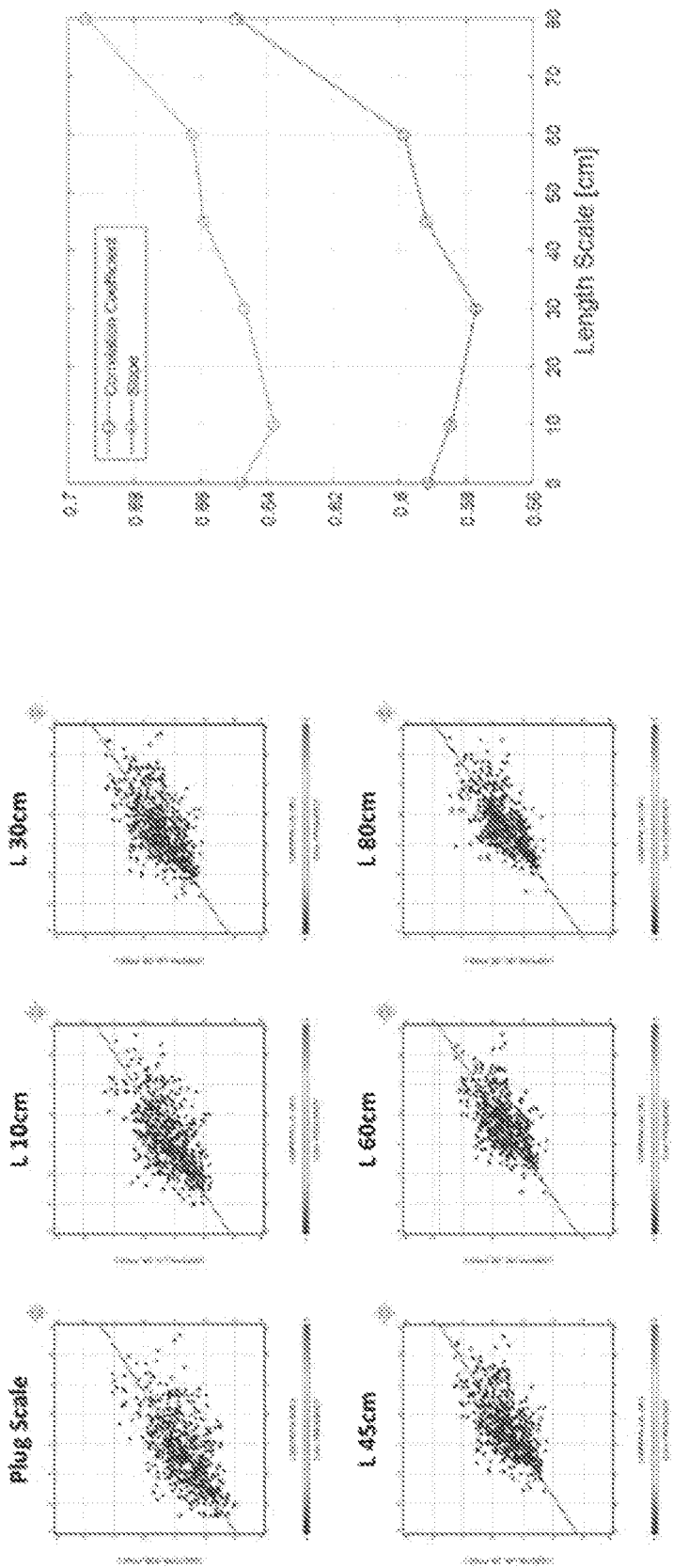
FIG. 13A illustrates the estimated upscaled subsurface data sets at different lengths compared to subsurface data sets, in accordance with one or more implementations.
FIG. 13B illustrates the correlation coefficient and slope from linear regression through estimated permeability as a function of core permeability, in accordance with one or more implementations.
Figure 14:
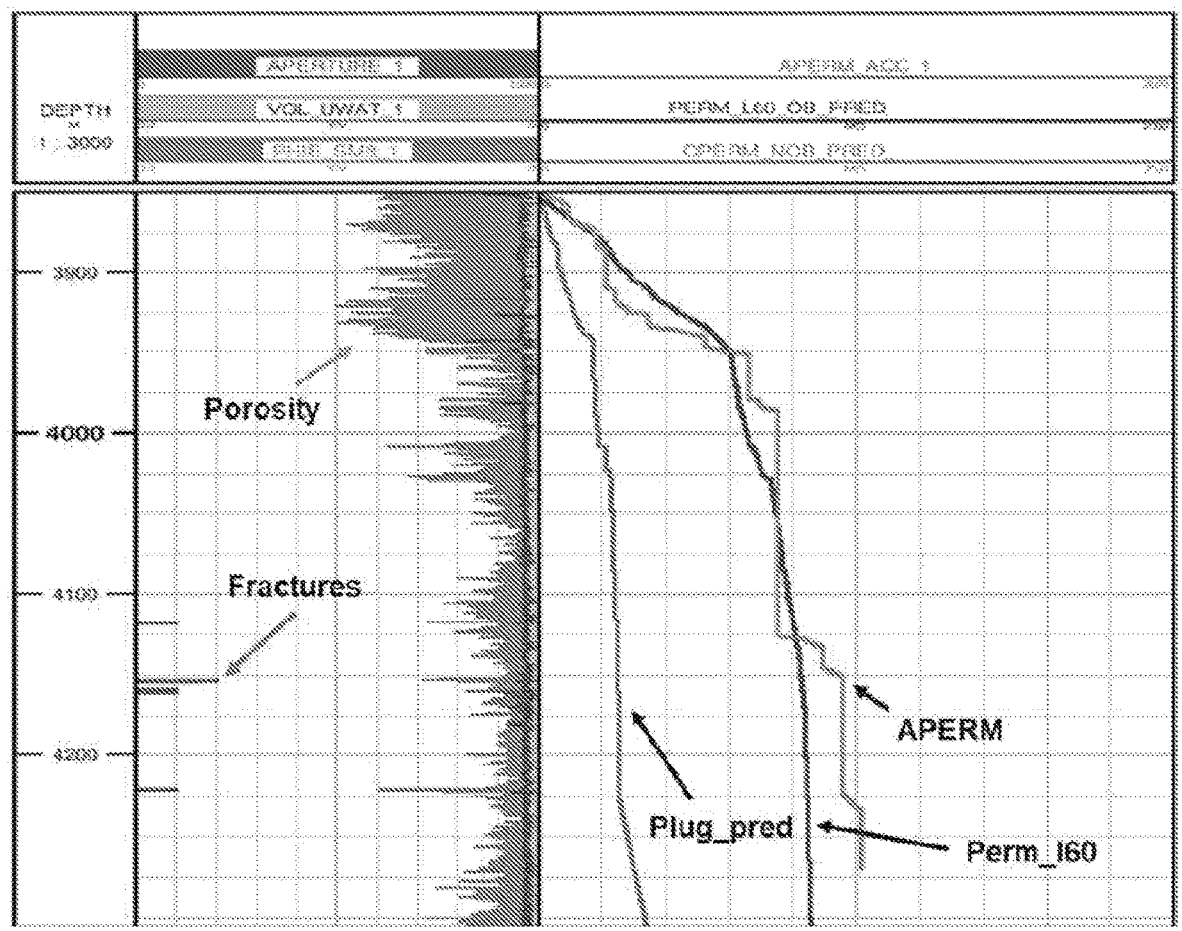
FIG. 14 illustrates the cumulative permeability depth profiles against predicted plug scale and upscaled log permeabilities and permeability derived using production logging tool data, in accordance with one or more implementations.

The refined subsurface model may be a combination of the subsurface models, as illustrated in FIG. 13A, where the log scale increases to about 80 centimeters. FIG. 13B illustrates the correlation coefficient and slope from linear regression through estimated permeability as a function of core permeability, in accordance with one or more implementations. FIG. 14 illustrates the cumulative permeability depth profiles against predicted plug scale and upscaled log permeabilities and permeability derived using production logging tool data, in accordance with one or more implementations. Perm-I60 indicates the upscaled permeability, while the data from the production log is represented by (APERM).

Referring back to FIG. 1, subsurface model component 116 may be configured to store the refined subsurface model in the electronic storage.

Subsurface model component 116 may be configured to obtain the refined subsurface model.

In some implementations, server(s) 102, client computing platform(s) 104, and/or external resources 116 may be operatively linked via one or more electronic communication links. For example, such electronic communication links may be established, at least in part, via a network such as the Internet and/or other networks. It will be appreciated that this is not intended to be limiting, and that the scope of this disclosure includes implementations in which server(s) 102, client computing platform(s) 104, and/or external resources 116 may be operatively linked via some other communication media.

A given client computing platform 104 may include one or more processors configured to execute computer program components. The computer program components may be configured to enable an expert or user associated with the given client computing platform 104 to interface with system 100 and/or external resources 116, and/or provide other functionality attributed herein to client computing platform(s) 104. By way of non-limiting example, the given client computing platform 104 may include one or more of a desktop computer, a laptop computer, a handheld computer, a tablet computing platform, a NetBook, a Smartphone, a gaming console, and/or other computing platforms.

External resources 116 may include sources of information outside of system 100, external entities participating with system 100, and/or other resources. In some implementations, some or all of the functionality attributed herein to external resources 116 may be provided by resources included in system 100.

Server(s) 102 may include electronic storage 118, one or more processors 120, and/or other components. Server(s) 102 may include communication lines, or ports to enable the exchange of information with a network and/or other computing platforms. Illustration of server(s) 102 in FIG. 1 is not intended to be limiting. Server(s) 102 may include a plurality of hardware, software, and/or firmware components operating together to provide the functionality attributed herein to server(s) 102. For example, server(s) 102 may be implemented by a cloud of computing platforms operating together as server(s) 102.

Electronic storage 118 may include non-transitory storage media that electronically stores information. The electronic storage media of electronic storage 118 may include one or both of system storage that is provided integrally (i.e., substantially non-removable) with server(s) 102 and/or removable storage that is removably connectable to server(s) 102 via, for example, a port (e.g., a USB port, a firewire port, etc.) or a drive (e.g., a disk drive, etc.). Electronic storage 118 may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. Electronic storage 118 may include one or more virtual storage resources (e.g., cloud storage, a virtual private network, and/or other virtual storage resources). Electronic storage 118 may store software algorithms, information determined by processor(s) 120, information received from server(s) 102, information received from client computing platform(s) 104, and/or other information that enables server(s) 102 to function as described herein.

Processor(s) 120 may be configured to provide information processing capabilities in server(s) 102. As such, processor(s) 120 may include one or more of a physical computer processor, a digital processor, an analog processor, a digital circuit designed to process information, an analog circuit designed to process information, a state machine, and/or other mechanisms for electronically processing information. Although processor(s) 120 is shown in FIG. 1 as a single entity, this is for illustrative purposes only. In some implementations, processor(s) 120 may include a plurality of processing units. These processing units may be physically located within the same device, or processor(s) 120 may represent processing functionality of a plurality of devices operating in coordination. Processor(s) 120 may be configured to execute components 108, 110, 112, 114, and/or other components. Processor(s) 120 may be configured to execute components 108, 110, 112, 114, and/or other components by software; hardware; firmware; some combination of software, hardware, and/or firmware; and/or other mechanisms for configuring processing capabilities on processor(s) 120. As used herein, the term "component" may refer to any component or set of components that perform the functionality attributed to the component. This may include one or more physical processors during execution of processor readable instructions, the processor readable instructions, circuitry, hardware, storage media, or any other components.

It should be appreciated that although components 108, 110, 112, and 114 are illustrated in FIG. 1 as being implemented within a single processing unit, in implementations in which processor(s) 120 includes multiple processing units, one or more of components 108, 110, 112, and/or 114 may be implemented remotely from the other components. The description of the functionality provided by the different components 108, 110, 112, and/or 114 described below is for illustrative purposes, and is not intended to be limiting, as any of components 108, 110, 112, and/or 114 may provide more or less functionality than is described. For example, one or more of components 108, 110, 112, and/or 114 may be eliminated, and some or all of its functionality may be provided by other ones of components 108, 110, 112, and/or 114. As another example, processor(s) 120 may be configured to execute one or more additional components that may perform some or all of the functionality attributed below to one of components 108, 110, 112, and/or 114.

Figure 2:
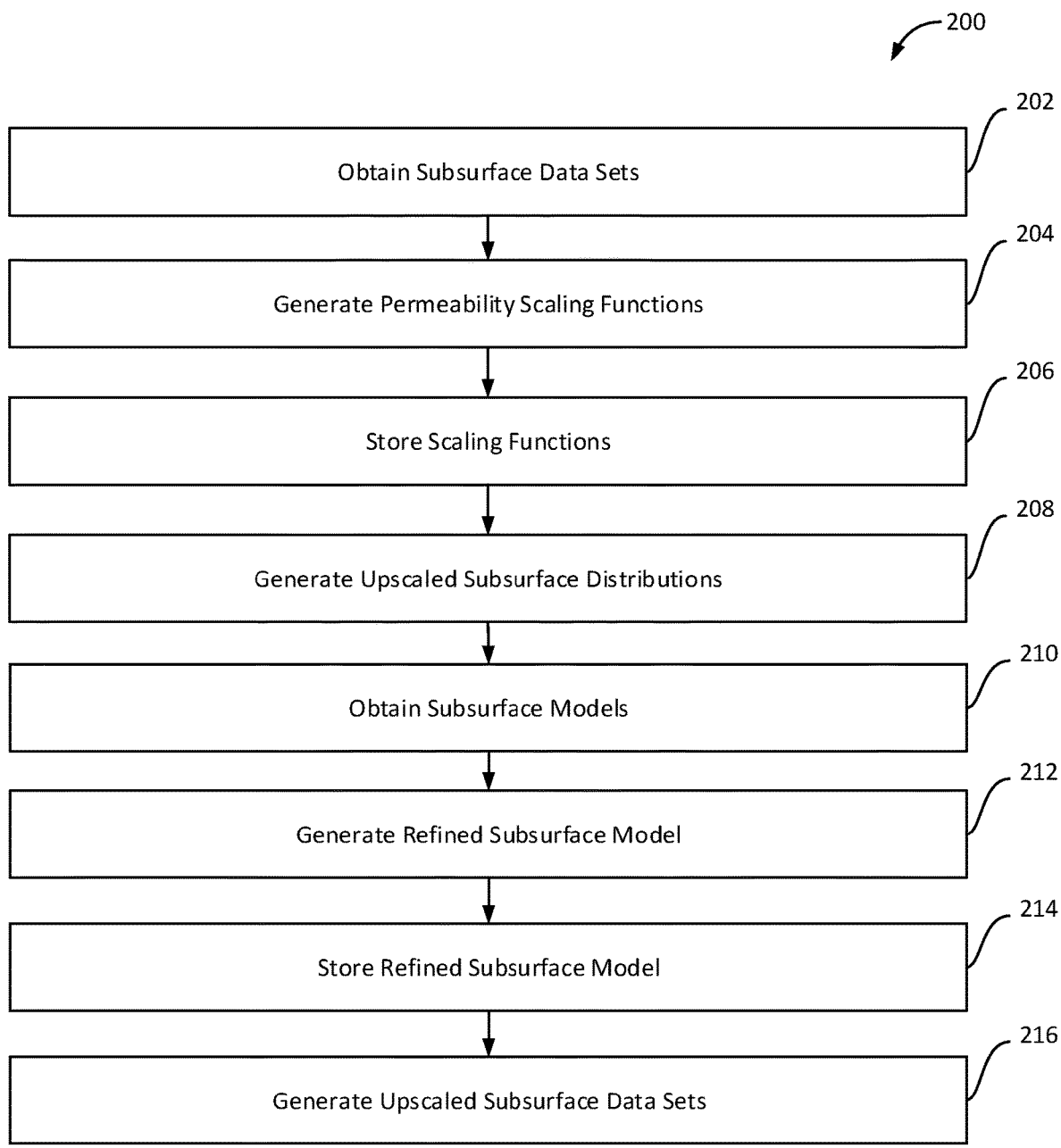
FIG. 2 illustrates a method for estimating permeability of different features of interest, in accordance with one or more implementations.
Figure 3:
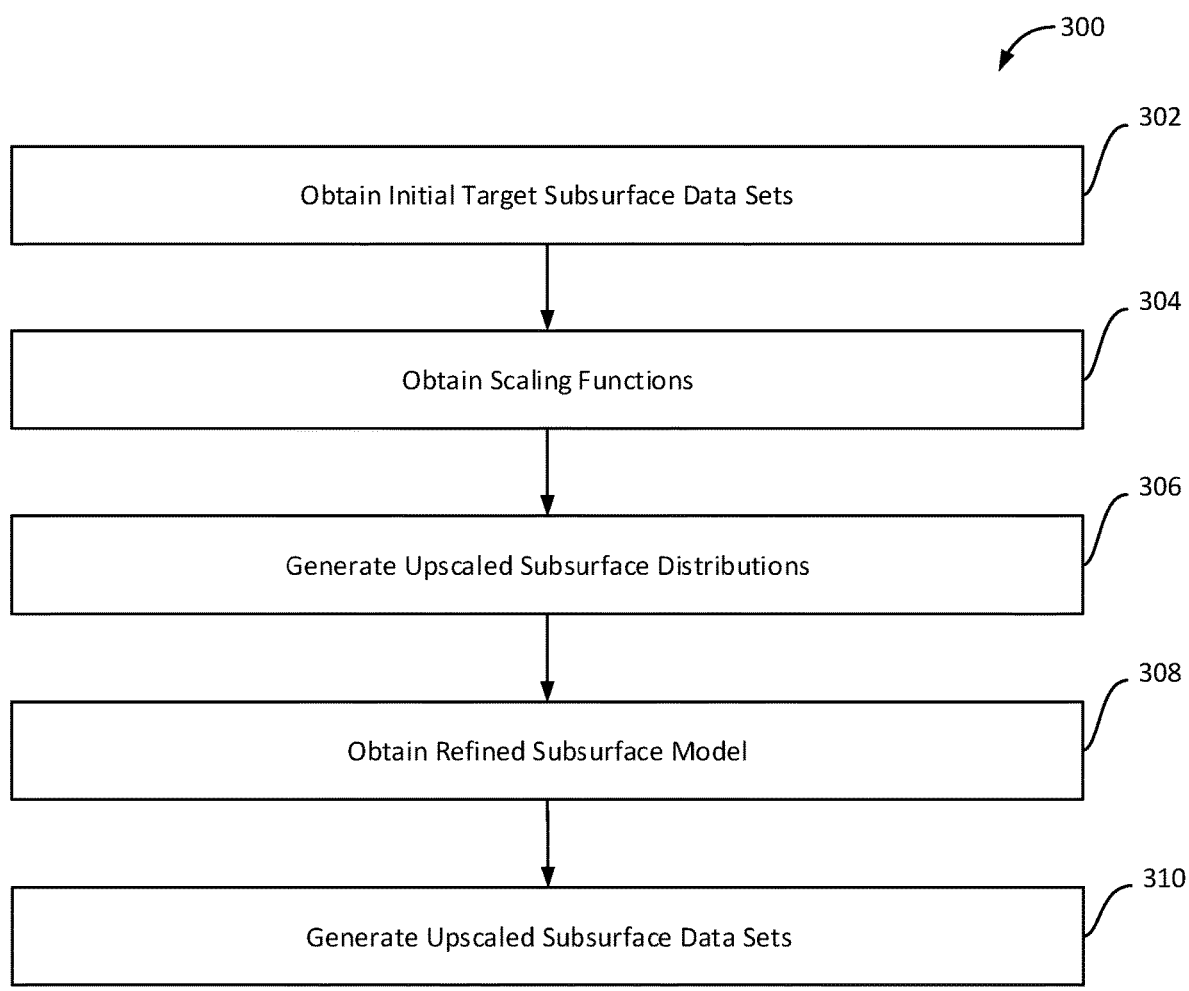
FIG. 3 illustrates a method for estimating permeability of different features of interest, in accordance with one or more implementations.

FIG. 2 illustrates a method 200 for estimating permeability for different features of interest, in accordance with one or more implementations. The operations of method 200 and 300 presented below are intended to be illustrative. In some implementations, method 200 and 300 may be accomplished with one or more additional operations not described, and/or without one or more of the operations discussed. Additionally, the order in which the operations of methods 200 and 300 are illustrated in FIGS. 2 and 3 and described below is not intended to be limiting.

In some implementations, methods 200 and 300 may be implemented in one or more processing devices (e.g., a physical computer processor, a digital processor, an analog processor, a digital circuit designed to process information, an analog circuit designed to process information, a state machine, and/or other mechanisms for electronically processing information). The one or more processing devices may include one or more devices executing some or all of the operations of methods 200 and 300 in response to instructions stored electronically on an electronic storage medium. The one or more processing devices may include one or more devices configured through hardware, firmware, and/or software to be specifically designed for execution of one or more of the operations of methods 200 and 300.

An operation 202 may include obtaining, from the electronic storage, subsurface data sets. A given subsurface data set may correspond to a given region of interest within a given feature of interest and may specify permeability values as a function of position within the given region of interest. Operation 202 may be performed by one or more physical computer processors configured by machine-readable instructions including a component that is the same as or similar to subsurface data set component 108, in accordance with one or more implementations.

An operation 204 may include generating, with the one or more physical computer processors, permeability scaling functions for individual features of interest. The permeability scaling functions for the given feature of interest may be generated based on the subsurface data sets. Operation 204 may be performed by one or more physical computer processors configured by machine-readable instructions including a component that is the same as or similar to permeability scaling function component 110, in accordance with one or more implementations.

An operation 206 may include storing the permeability scaling functions in the electronic storage. Operation 206 may be performed by one or more physical computer processors configured by machine-readable instructions including a component that is the same as or similar to permeability scaling function component 110, in accordance with one or more implementations.

An operation 208 may include generating, with the one or more physical computer processors, upscaled subsurface distributions using the permeability scaling functions. The upscaled subsurface distributions may correspond to a larger region of interest within the given feature of interest and estimates permeability distributions of the larger region of interest. Operation 208 may be performed by one or more physical computer processors configured by machine-readable instructions including a component that is the same as or similar to subsurface distribution component 112, in accordance with one or more implementations.

An operation 210 may include obtaining, from the electronic storage, subsurface models of the region of interest. Operation 210 may be performed by one or more physical computer processors configured by machine-readable instructions including a component that is the same as or similar to subsurface model component 114, in accordance with one or more implementations.

An operation 212 may include generating a refined subsurface model by training, on the one or more physical computer processors using the upscaled subsurface distributions, the subsurface models. Operation 212 may be performed by one or more physical computer processors configured by machine-readable instructions including a component that is the same as or similar to subsurface model component 114, in accordance with one or more implementations.

An operation 214 may include storing the refined subsurface model in the electronic storage. Operation 214 may be performed by one or more physical computer processors configured by machine-readable instructions including a component that is the same as or similar to subsurface model component 114, in accordance with one or more implementations.

An operation 216 may include using, with the one or more physical computer processors, the refined subsurface model to estimate upscaled subsurface data sets. Operation 216 may be performed by one or more physical computer processors configured by machine-readable instructions including a component that is the same as or similar to subsurface data set component 108, in accordance with one or more implementations.

FIG. 3 illustrates a method 300 for estimating permeability for different features of interest, in accordance with one or more implementations. An operation 302 may include obtaining initial target subsurface data sets of a region of interest. Operation 302 may be performed by one or more physical computer processors configured by machine-readable instructions including a component that is the same as or similar to subsurface data set component 108, in accordance with one or more implementations.

An operation 304 may include obtaining, from the electronic storage, permeability scaling functions. A given permeability scaling function may have been generated based on subsurface data sets. Operation 304 may be performed by one or more physical computer processors configured by machine-readable instructions including a component that is the same as or similar to permeability scaling function component 110, in accordance with one or more implementations.

An operation 306 may include generating, with the one or more physical computer processors, upscaled target subsurface distributions using the permeability scaling functions. The upscaled subsurface distributions may correspond to a larger region of interest within a given feature of interest and may estimate permeability distributions of the larger region of interest. Operation 306 may be performed by one or more physical computer processors configured by machine-readable instructions including a component that is the same as or similar to subsurface distribution component 112, in accordance with one or more implementations.

An operation 308 may include obtaining, from the electronic storage, a refined subsurface model. The refined subsurface model may have been trained using subsurface models. Operation 308 may be performed by one or more physical computer processors configured by machine-readable instructions including a component that is the same as or similar to subsurface model component 114, in accordance with one or more implementations.

Figure 4:
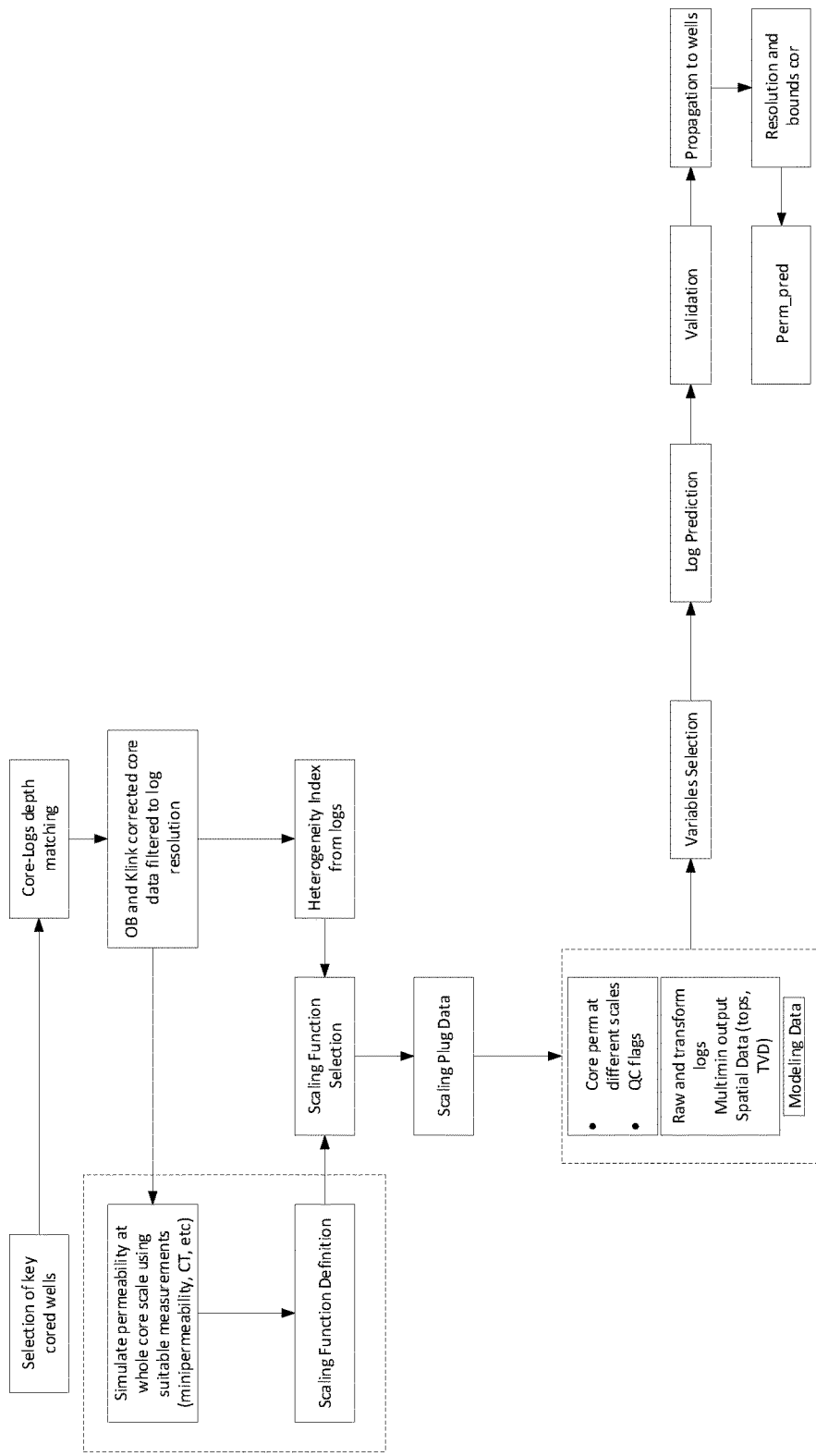
FIG. 4 illustrates a workflow for estimating permeability of different features of interest, in accordance with one or more implementations.

An operation 310 may include using, with the one or more physical computer processors, the refined subsurface model to generate upscaled target subsurface data sets. Operation 310 may be performed by one or more physical computer processors configured by machine-readable instructions including a component that is the same as or similar to subsurface data set component 108, in accordance with one or more implementations FIG. 4 illustrates a workflow for estimating permeability from logs using permeability scaling functions, in accordance with one or more implementations. The workflow may start with the selection of key cored wells. The core logs may be matched to a given depth. The core log data may be filtered and corrected using various algorithms, such as an overburden correction and a Klinkenberg correction. In some implementations, the filtered and/or corrected data may be used to simulate permeability at a whole core scale using a mini-permeameter and a CT device to create permeability spatial distributions. The permeability spatial distributions may be used in a Darcy solver to determine a scaling function. In some implementations, the filtered and/or corrected data may be used in heterogeneity indices to determine a scaling function. The scaling function may be determined based on the classification of a rock.

The scaling function helps estimate upscaled core log data sets. The scaling function may be applied to upscale the core log data. The upscaled core log data may be scaled to different lengths and analyzed. Modeling data may include logs, raw logs, transform logs, and/or other data, as described herein. In order to select variables, machine learning is applied to predict a combination of logs to estimate the core log data at a larger scale. The combination of logs is then validated using a blind test. The resulting data may be used to estimate permeability.

Figure 15:
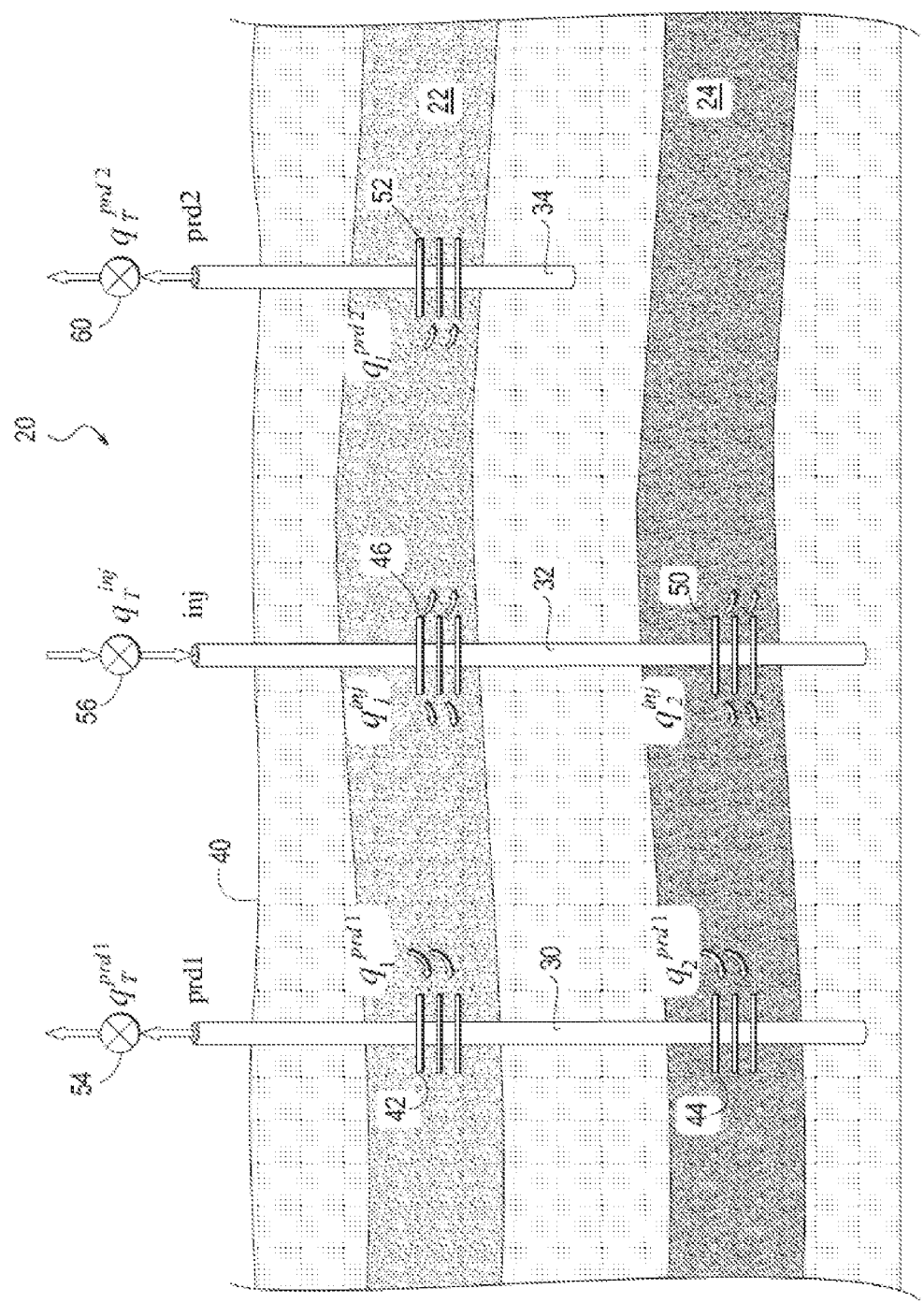
FIG. 15 schematically illustrates one implementation of a multilayered subsurface with a plurality of wellbores.

FIG. 15 schematically illustrates one implementation of a multilayered subsurface with a plurality of wellbores. Subsurface 20 can be any type of subsurface formation in which hydrocarbons are stored, such as limestone, dolomite, oil shale, sandstone, or a combination thereof. As illustrated in FIG. 15, production wellbores 30, 34 and injection wellbore 32 are drilled and completed in subsurface 20. Production or injection wellbores can deviate from the vertical position such that in some implementations, one or more wellbores can be a directional wellbore, horizontal wellbore, or a multilateral wellbore. In implementations, fewer or additional injection wellbores and/or production wellbores can also extend into hydrocarbon bearing zones 22, 24 of subsurface 20. Subsurface 20 includes a plurality of rock layers including hydrocarbon bearing strata or zones 22, 24. In implementations, the subterranean reservoir 20 may include more zones than those illustrated in FIG. 15. Production wellbores 30, 34 and injection wellbore 32 extend into one or more of the plurality of rock layers (e.g., hydrocarbon bearing strata or zones 22, 24) of subterranean reservoir 20 such that the production wellbores 30, 34 and injection wellbore 32 are in fluid communication with hydrocarbon bearing zones 22, 24. For example, production wellbores 30, 34 can receive fluids (e.g., gas, oil, water) from hydrocarbon bearing zones 22, 24 and injection wellbore 32 can inject fluid into hydrocarbon bearing zones 22, 24. Accordingly, production wellbores 30, 34 and injection wellbore 32 fluidly connect hydrocarbon bearing zones 22, 24 to surface 40 of subsurface 20. Surface 40 of subsurface 20 can be a ground surface as depicted in FIG. 15 or a platform surface in an offshore environment.

As one skilled in the art will recognize, production or injection wellbores can be completed in any manner (e.g., an openhole completion, a cemented casing and/or liner completion, a gravel-packed completion, etc.). As shown in FIG. 15, completions 42, 44, 46, 50, 52 provide fluid communication between injection wellbore 32, hydrocarbon bearing zones 22, 24, and production wellbores 30, 34. Production wellbore 34 only connects with upper hydrocarbon bearing zone 22. Chokes or well control devices 54, 56, 60 are used to control the flow of fluid into and out of respective production wellbores 30, 34 and injection wellbore 32. Well control devices 54, 56, 60 also control the pressure profiles in production wellbores 30, 34 and injection wellbore 32. Although not shown, production wellbores 30, 34 and injection wellbore 32 fluidly connect with surface facilities (e.g., oil/gas/water separators, gas compressors, storage tanks, pumps, gauges, pipelines). The rate of flow of fluids through production wellbores 30, 34 and injection wellbore 32 may be limited by the fluid handling capacities of the surface facilities. Core samples may be extracted from production wellbores 30, 34 and injection wellbore 32 used in implementations provided herein. Furthermore, while control devices 54, 56, 60 are shown above surface in FIG. 15, control devices can also be positioned downhole to control the flow of fluids injected into or received from each of hydrocarbon bearing zones 22, 24. More information may be found in US Patent Application Publication No. 2014/0288909 (Attorney Dkt. No. T-9407) and US Patent Application Publication No. 2017/0058186 (Attorney Dkt. No. T-10197), both of which are incorporated herein by reference in their entireties.

The implementations provided herein may be utilized to determine placement of a wellbore, such as the injection wellbore 32 and the production wellbores 30, 34 of FIG. 15. Furthermore, the implementations provided herein may be utilized for handling injection rates, handling production rates, reservoir modeling, production forecasts, and/or other purposes.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

Terminology

The following terms will be used throughout the specification and will have the following meanings unless otherwise indicated.

"Subsurface" refers to practically anything below a surface, such as below the earth's surface, below the ocean's surface, etc. The subsurface may include faults, fractures, geobodies, overburdens, underburdens, salts, salt welds, rocks, sands, sediments, etc. The subsurface may be onshore, offshore (e.g., shallow water or deep water), etc. Indeed, it should be appreciated that the term "subsurface," as used herein, may include practically any geologic points or volume(s) of interest (such as a survey area). It should be appreciated that subsurface may include one or more region of interest, as described herein.

Furthermore, the subsurface may include hydrocarbons, such as liquid hydrocarbons (also known as oil or petroleum), gas hydrocarbons, a combination of liquid hydrocarbons and gas hydrocarbons, etc. One measure of the heaviness or lightness of a liquid hydrocarbon is American Petroleum Institute (API) gravity. According to this scale, light crude oil is defined as having an API gravity greater than 31.1° API (less than 870 kg/m3), medium oil is defined as having an API gravity between 22.3° API and 31.1° API (870 to 920 kg/m3), heavy crude oil is defined as having an API gravity between 10.0° API and 22.3° API (920 to 1000 kg/m3), and extra heavy oil is defined with API gravity below 10.0° API (greater than 1000 kg/m3). Light crude oil, medium oil, heavy crude oil, and extra heavy oil are examples of hydrocarbons. Indeed, examples of hydrocarbons may be conventional oil, natural gas, kerogen, bitumen, heavy oil, clathrates (also known as hydrates), or any combination thereof.

The hydrocarbons may be recovered from the entire subsurface or from a portion of the subsurface. For example, the subsurface may be divided up into one or more hydrocarbon zones, and hydrocarbons can be recovered from each desired hydrocarbon zone. In some implementations, one or more of hydrocarbon zones may even be shut in to increase hydrocarbon recovery from a hydrocarbon zone that is not shut in.

The hydrocarbons may be recovered from the subsurface using primary recovery (e.g., by relying on pressure to recover hydrocarbons), secondary recovery (e.g., by using water injection or natural gas injection to recover hydrocarbons), enhanced oil recovery (EOR), or any combination thereof. The term "enhanced oil recovery" refers to techniques for increasing the amount of hydrocarbons that may be extracted from the subsurface. Enhanced oil recovery may also be referred to as improved oil recovery or tertiary oil recovery (as opposed to primary and secondary oil recovery).

Examples of EOR operations include, for example, (a) miscible gas injection (which includes, for example, carbon dioxide flooding), (b) chemical injection (sometimes referred to as chemical enhanced oil recovery (CEOR), and which includes, for example, polymer flooding, alkaline flooding, surfactant flooding, conformance control operations, as well as combinations thereof such as alkaline-polymer flooding, surfactant-polymer (SP) flooding, or alkaline-surfactant-polymer flooding), (c) microbial injection, and (d) thermal recovery (which includes, for example, cyclic steam and steam flooding). In some implementations, the EOR operation can include a polymer (P) flooding operation, an alkaline-polymer (AP) flooding operation, a surfactant-polymer (SP) flooding operation, an alkaline-surfactant-polymer (ASP) flooding operation, a conformance control operation, or any combination thereof. The terms "operation" and "application" may be used interchangeability herein, as in EOR operations or EOR applications.

The hydrocarbons may be recovered from the subsurface using radio frequency (RF) heating. For example, at least one radio frequency antenna may be utilized to increase the temperature of the oil and reduce the oil's viscosity. The oil can then be produced from the subsurface with an improved oil flow rate. Radio frequency may also be used in combination with at least one other recovery technique, such as steam flooding, as described in U.S. Pat. No. 9,284,826, which is incorporated by reference in its entirety.

The hydrocarbons may be recovered from the subsurface using fracturing. For example, fracturing may include hydraulic fracturing, fracturing using electrodes, such as described in U.S. Pat. No. 9,840,898, etc. Fracturing may also be used in combination with at least one other recovery technique. Fracturing may be used to recover hydrocarbons from new reservoirs. Fracturing may also be used to help recover hydrocarbons from mature fields, for example, by waterflooding or steamflooding the mature fields after fracturing the mature fields. Mature fields are broadly defined as hydrocarbon fields where production has already peaked and production is currently declining.

The subsurface, the hydrocarbons, or both may also include non-hydrocarbon items, such as pore space, connate water, brine, tracers, items used in enhanced oil recovery (e.g., polymer and fluid used in chemical enhanced oil recovery), items from other types of treatments (e.g., gels used in conformance control), etc.

In short, each subsurface may have a variety of characteristics, such as petrophysical rock properties, reservoir fluid properties, reservoir conditions, or any combination thereof, such as temperature, porosity, permeability, water composition, mineralogy, hydrocarbon type, hydrocarbon quantity, reservoir location, pressure, etc. Moreover, in some implementations, the subsurface may be or include: tight gas, shale gas, tight oil, tight carbonate, diatomite, geothermal, coalbed methane, a methane hydrate containing subsurface, a mineral containing subsurface, a metal containing subsurface, a subsurface having a permeability in the range of 0.01 microdarcy to 10 millidarcy, a subsurface having a permeability in the range of 10 millidarcy to 40,000 millidarcy, etc. The term "subsurface" may be used synonymously with the term "reservoir" or "formation". The terms "subsurface," "hydrocarbon," and the like are not limited to any description or configuration described herein.

"Wellbore" refers to a single hole for use in hydrocarbon recovery. For example, a wellbore may be a cylindrical hole drilled into the subsurface such that the wellbore is surrounded by the subsurface. The wellbore may also be perforated for fluidic communication with the subsurface. The wellbore may be used for injection in some implementations. The wellbore may be used for production in some implementations. The wellbore may be used for fracturing in some implementations. The wellbore may be used for a single function, such as only injection, in some implementations. The wellbore may be used for a plurality of functions, such as both injection and production in some implementations. Oftentimes, the hydrocarbons may be swept from a single injection wellbore towards at least one production wellbore and then up towards the surface. A plurality of wellbores (e.g., tens to hundreds of wellbores) are oftentimes used to recover hydrocarbons from the subsurface.

The wellbore may include a casing, a liner, a tubing string, a heating element, a wellhead, a tree, a sensor, a packer, a screen, a gravel pack, etc. The "casing" refers to a steel pipe cemented in place during the wellbore construction process to stabilize the wellbore. The "liner" refers to any string of casing in which the top does not extend to the surface but instead is suspended from inside the previous casing. The "tubing string" or simply "tubing" is made up of a plurality of tubulars (e.g., tubing, tubing joints, pup joints, etc.) connected together. The tubing string is lowered into the casing or the liner for injecting a fluid into the subsurface, producing a fluid from the subsurface, or any combination thereof. The casing may be cemented into the wellbore with the cement placed in the annulus between the subsurface and the outside of the casing. The tubing string and the liner are typically not cemented in the wellbore. The wellbore may also include any completion physical computer that is not discussed separately. If the wellbore is drilled into an offshore subsurface, the wellbore may include some of the previous components as well as a riser, an umbilical, a subsea manifold, a subsea tree, remotely operated vehicle (ROV), etc.

The wellbore may have vertical, horizontal, or combination trajectories. For example, the wellbore may be referred to as a vertical wellbore, a horizontal wellbore, a multilateral wellbore, an inclined wellbore, a slanted wellbore, etc. The wellbore may include an openhole portion. "Openhole" refers to an uncased portion of a wellbore. While most wellbores are cased, some have an openhole portion, especially horizontal or extended-reach wellbores.

The wellbore may include a "deviated section." "Deviated section" refers to practically any section of a wellbore where the deviation is changing. As an example, the deviation is changing when the wellbore is curving. In a horizontal wellbore, the deviated section is the curved section between the vertical section of the horizontal wellbore and the horizontal section of the horizontal wellbore. Of note, wellbores that are not horizontal wellbores may also include a deviated section. For example, inclined or slanted wellbores may each include a deviated section. In some implementations, a deviated section may exist in a wellbore when there is a deviation in the order of at least one seismic wavelength.

The wellbore may be drilled into the subsurface using directional drilling techniques and equipment, steering (e.g., geosteering) techniques and equipment, or practically any drilling techniques and equipment known in the art. For example, drilling the wellbore may include using a tool such as drilling tool. The drilling tool may include a drill bit, a drill string, a drilling fluid (sometimes referred to as drilling mud), etc. One or more tools may also be used, such as any number of measurement-while-drilling (MWD) tools, seismic-while-drilling (SWD) tools, wireline tools, logging-while-drilling (LWD) tools, or other downhole or reservoir tools. After drilling to a predetermined depth, the drill string and drill bit are removed, and then casing, tubing, etc. may be installed. The term "wellbore" may be used synonymously with the terms "borehole," "well," or "well bore." The term "wellbore" is not limited to any description or configuration described herein.

As used in this specification and the following claims, the term "proximate" is defined as "near". If item A is proximate to item B, then item A is near item B. For example, in some implementations, item A may be in contact with item B. For example, in some implementations, there may be at least one barrier between item A and item B such that item A and item B are near each other, but not in contact with each other. The barrier may be a fluid barrier, a non-fluid barrier (e.g., a structural barrier), or any combination thereof.

As used in this specification and the following claims, the terms "comprise" (as well as forms, derivatives, or variations thereof, such as "comprising" and "comprises") and "include" (as well as forms, derivatives, or variations thereof, such as "including" and "includes") are inclusive (i.e., open-ended) and do not exclude additional elements or steps. For example, the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Accordingly, these terms are intended to not only cover the recited element(s) or step(s), but may also include other elements or steps not expressly recited. Furthermore, as used herein, the use of the terms "a" or "an" when used in conjunction with an element may mean "one," but it is also consistent with the meaning of "one or more," "at least one," and "one or more than one." Therefore, an element preceded by "a" or "an" does not, without more constraints, preclude the existence of additional identical elements.

The use of the term "about" applies to all numeric values, whether or not explicitly indicated. This term generally refers to a range of numbers that one of ordinary skill in the art would consider as a reasonable amount of deviation to the recited numeric values (i.e., having the equivalent function or result). For example, this term can be construed as including a deviation of ±10 percent of the given numeric value provided such a deviation does not alter the end function or result of the value. Therefore, a value of about 1% can be construed to be a range from 0.9% to 1.1%. Furthermore, a range may be construed to include the start and the end of the range. For example, a range of 10% to 20% (i.e., range of 10%-20%) includes 10% and also includes 20%, as well as percentages in between 10% and 20%, unless explicitly stated otherwise herein.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

It is understood that when combinations, subsets, groups, etc. of elements are disclosed (e.g., combinations of components in a composition, or combinations of steps in a method), that while specific reference of each of the various individual and collective combinations and permutations of these elements may not be explicitly disclosed, each is specifically contemplated and described herein. By way of example, if an item is described herein as including a component of type A, a component of type B, a component of type C, or any combination thereof, it is understood that this phrase describes all of the various individual and collective combinations and permutations of these components. For example, in some implementations, the item described by this phrase could include only a component of type A. In some implementations, the item described by this phrase could include only a component of type B. In some implementations, the item described by this phrase could include only a component of type C. In some implementations, the item described by this phrase could include a component of type A and a component of type B. In some implementations, the item described by this phrase could include a component of type A and a component of type C. In some implementations, the item described by this phrase could include a component of type B and a component of type C. In some implementations, the item described by this phrase could include a component of type A, a component of type B, and a component of type C. In some implementations, the item described by this phrase could include two or more components of type A (e.g., A1 and A2). In some implementations, the item described by this phrase could include two or more components of type B (e.g., B1 and B2). In some implementations, the item described by this phrase could include two or more components of type C (e.g., C1 and C2). In some implementations, the item described by this phrase could include two or more of a first component (e.g., two or more components of type A (A1 and A2)), optionally one or more of a second component (e.g., optionally one or more components of type B), and optionally one or more of a third component (e.g., optionally one or more components of type C). In some implementations, the item described by this phrase could include two or more of a first component (e.g., two or more components of type B (B1 and B2)), optionally one or more of a second component (e.g., optionally one or more components of type A), and optionally one or more of a third component (e.g., optionally one or more components of type C). In some implementations, the item described by this phrase could include two or more of a first component (e.g., two or more components of type C (C1 and C2)), optionally one or more of a second component (e.g., optionally one or more components of type A), and optionally one or more of a third component (e.g., optionally one or more components of type B).

Unless defined otherwise, all technical and scientific terms used herein have the same meanings as commonly understood by one of skill in the art to which the presently disclosed technology belongs. All citations referred herein are expressly incorporated herein by reference.

Although some of the various drawings illustrate a number of logical stages in a particular order, stages that are not order dependent may be reordered and other stages may be combined or broken out. While some reordering or other groupings are specifically mentioned, others will be obvious to those of ordinary skill in the art and so do not present an exhaustive list of alternatives. Moreover, it should be recognized that the stages could be implemented in hardware, firmware, software, or any combination thereof.

This written description uses examples to disclose the presently disclosed technology, including the best mode, and also to enable any person skilled in the art to make and use the presently disclosed technology. The patentable scope is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

The drawings illustrate only typical implementations of the presently disclosed technology and therefore, are not to be considered limiting of its scope and breadth. As is described herein, the presently disclosed technology can be implemented in numerous ways, including for example as a method (e.g., including a computer-implemented method), a system (e.g., including a computer system), a non-transitory computer readable medium, etc.

What is claimed is:

1. A computer-implemented method for generating permeability scaling functions for different features of interest to estimate permeability, the method being implemented in a computer system, the computer system including one or more physical computer processors and non-transient electronic storage, the method comprising:

obtaining, from the electronic storage, subsurface data sets, wherein a given subsurface data set corresponds to a given region of interest within a given feature of interest and specifies permeability values as a function of position within the given region of interest, the given feature of interest including a given type of rock;

generating, with the one or more physical computer processors, permeability scaling functions for individual features of interest, wherein the permeability scaling functions for the given feature of interest is generated based on the subsurface data sets, wherein generating a given permeability scaling function for the given feature of interest includes performing fluid flow simulation of the given feature of interest at different sample sizes to determine non-linear scaling of permeability with increase in size, wherein the non-linear scaling of the permeability with increase in size reflects heterogeneity of the given type of rock within the given feature of interest;

storing the permeability scaling functions for the individual features of interest in the electronic storage, wherein different ones of the permeability scaling functions correspond to different types of rock; and generating, with the one or more physical computer processors, upscaled subsurface distributions for the given feature of interest using the given permeability scaling function for the given feature of interest, wherein the upscaled subsurface distributions corresponds to a larger region of interest within the given feature of interest and estimates permeability distributions of the larger region of interest within the given feature of interest by taking into account both the given type of rock within the given feature of interest and size of the larger region of interest within the given feature of interest, and by incorporating the non-linear scaling of the permeability corresponding to the heterogeneity of the given type of rock within the given feature of interest.

2. The computer-implemented method of claim 1, further comprising:

obtaining, from the electronic storage, subsurface models of the given region of interest;

generating, with the one or more physical computer processors, a refined subsurface model by training, on the one or more physical computer processors using the upscaled subsurface distributions, the subsurface models;

storing the refined subsurface model in the electronic storage; and using, with the one or more physical computer processors, the refined subsurface model to estimate upscaled subsurface data sets.

3. The computer-implemented method of claim 2, wherein training the subsurface models comprises using a k-nearest neighbor method to determine a combination of subsurface models to fit the upscaled subsurface distributions.

4. The computer-implemented method of claim 1, wherein the subsurface data sets comprise permeability spatial distributions using permeability measurements and tomographic imaging of a core slab.

5. The computer-implemented method of claim 4, wherein generating permeability scaling functions comprises:
using, with the one or more physical computer processors, a Darcy solver on the permeability spatial distributions; and
grouping, with the one or more physical computer processors, solved permeability spatial distributions by individual features of interest.

6. The computer-implemented method of claim 1, wherein obtaining the subsurface data sets includes performing permeability measurement using a mini-permeameter.

7. The computer-implemented method of claim 1, wherein the computer system further comprises a computed tomography device to generate a permeability spatial distribution of the region of interest.

8. A computer-implemented method for estimating permeability for different features of interest, the method being implemented in a computer system, the computer system, including one or more physical computer processors and non-transient electronic storage, the method comprising:
obtaining, with the one or more physical computer processors, initial target subsurface data sets of a region of interest;
obtaining, with the one or more physical computer processors, permeability scaling functions, wherein the permeability scaling functions are generated based on subsurface data sets, different ones of the permeability scaling functions corresponding to different types of rock, wherein the subsurface data sets comprise permeability spatial distributions using permeability measurements and tomographic imaging of a core slab, wherein a given feature of interest includes a given type of rock and a given permeability scaling function for the given feature of interest is generated by performing fluid flow simulation of the given feature of interest at different sample sizes to determine non-linear scaling of permeability with increase in size, wherein the non-linear scaling of the permeability with increase in size reflects heterogeneity of the given type of rock within the given feature of interest;
generating, with the one or more physical computer processors, upscaled target subsurface distributions for the given feature of interest using the given permeability scaling function for the given feature of interest, wherein the upscaled target subsurface distributions corresponds to a larger region of interest within the given feature of interest and estimates permeability distributions of the larger region of the larger region of interest within the given feature of interest by taking into account both the given type of rock within the given feature of interest and size of the larger region of interest within the given feature of interest, and by incorporating the non-linear scaling of the permeability corresponding to the heterogeneity of the given type of rock within the given feature of interest;
obtaining, with the one or more physical computer processors, a refined subsurface model, the refined subsurface model having been trained using subsurface models; and
using, with the one or more physical computer processors, the refined subsurface model to generate upscaled target subsurface data sets.

9. The computer-implemented method of claim 8, wherein the refined subsurface model comprises a combination of the subsurface models.

10. The computer-implemented method of claim 9, wherein using the refined subsurface model to generate upscaled target subsurface data sets comprises using the combination of subsurface models used in the refined subsurface model, such that data taken from the region of interest is used in the combination of subsurface models used.

11. The computer-implemented method of claim 8, wherein the subsurface data sets comprise heterogeneity metrics.

12. The computer-implemented method of claim 11, wherein the heterogeneity metrics comprise correspondences between a ratio of standard deviation to the average of the logarithm of permeability measurements and a scaling multiplier.

13. The computer-implemented method of claim 8, wherein obtaining the permeability scaling functions includes performing permeability measurement using a mini-permeameter.

14. A system configured for estimating permeability for different features of interest, the system comprising:
non-transient electronic storage; and
one or more physical computer processors configured by machine-readable instructions to:
obtain initial target subsurface data sets of a region of interest;
obtain permeability scaling functions, wherein the permeability scaling functions are generated based on subsurface data sets, different ones of the permeability scaling functions corresponding to different types of rock, wherein the subsurface data sets comprise permeability spatial distributions using permeability measurements and tomographic imaging of a core slab, wherein a given feature of interest includes a given type of rock and a given permeability scaling function for the given feature of interest is generated by performing fluid flow simulation of the given feature of interest at different sample sizes to determine non-linear scaling of permeability with increase in size, wherein the non-linear scaling of the permeability with increase in size reflects heterogeneity of the given type of rock within the given feature of interest;
generate upscaled target subsurface distributions for the given feature of interest using the given permeability scaling function& function for the given feature of interest, wherein the upscaled target subsurface distributions corresponds to a larger region of interest within the given feature of interest and estimates permeability distributions of the larger region of interest within the given feature of interest by taking into account both the given type of rock within the given feature of interest and size of the larger region of interest within the given feature of interest, and by incorporating the non-linear scaling of the permeability corresponding to the heterogeneity of the given type of rock within the given feature of interest;
obtain a refined subsurface model, the refined subsurface model having been trained using subsurface models; and
use the refined subsurface model to generate upscaled target subsurface data sets.

15. The system of claim 14, wherein generating permeability scaling functions comprises:
- using a Darcy solver on the permeability spatial distributions; and
- grouping solved permeability spatial distributions by individual features of interest.

16. The system of claim 14, wherein the subsurface data sets corn prise classifications of rock types.

17. The system of claim 14, wherein the subsurface data sets comprise heterogeneity metrics, wherein the heterogeneity metrics comprise one or more of correspondences between a Dykstra Parsons coefficient of plug permeability measurements and a scaling multiplier and correspondences between a ratio of standard deviation to the average of the logarithm of permeability measurements and ascaling multiplier.

18. The computer-implemented method of claim 1, wherein generating the given permeability scaling function for the given feature of interest includes determining size of a representative elementary volume for the given feature of interest, wherein permeability of the representative element volume is representative of permeability of larger size volumes within the given feature of interest.

19. The computer-implemented method of claim 1, further comprising generating, with the one or more physical computer processors, a view of the given permeability scaling function for the given feature of interest, the view of the given permeability scaling function for the given feature of interest including the permeability distributions at the different sample sizes and illustrating the non-linear scaling of permeability with increase in size.

20. The computer-implemented method of claim 1, further comprising generating, with the one or more physical computer processors, a view of multiple ones of the permeability scaling functions corresponding to multiple ones of the different types of rock, the view of multiple ones of the permeability scaling functions corresponding to multiple ones of the different types of rock illustrating different non-linear scaling of permeability with increase in size for the multiple ones of the different types of rock.

* * * * *